US011525638B2

(12) United States Patent
Vanderwees et al.

(10) Patent No.: US 11,525,638 B2
(45) Date of Patent: Dec. 13, 2022

(54) HIGH-PERFORMANCE HEAT EXCHANGER WITH CALIBRATED BYPASS

(71) Applicant: DANA CANADA CORPORATION, Oakville (CA)

(72) Inventors: Doug Vanderwees, Mississauga (CA); Kenneth M. A. Abels, Oakville (CA)

(73) Assignee: Dana Canada Corporation, Oakville (CA)

( * ) Notice: Subject to any disclaimer, the term of this patent is extended or adjusted under 35 U.S.C. 154(b) by 86 days.

(21) Appl. No.: 17/073,910

(22) Filed: Oct. 19, 2020

(65) Prior Publication Data
US 2022/0120518 A1  Apr. 21, 2022

(51) Int. Cl.
*F28F 3/12*  (2006.01)

(52) U.S. Cl.
CPC ..................... *F28F 3/12* (2013.01)

(58) Field of Classification Search
CPC .......... F28F 3/12; F28F 3/025; F28F 2250/06; H05K 7/20927
USPC ...................................................... 165/80.4
See application file for complete search history.

(56) References Cited

U.S. PATENT DOCUMENTS

| | | | |
|---|---|---|---|
| RE35,890 E | 9/1998 | So | |
| 6,273,183 B1 | 8/2001 | So | |
| 6,648,062 B2* | 11/2003 | Fukazu | H05K 7/20927 257/E23.098 |
| 7,200,007 B2* | 4/2007 | Yasui | H02M 7/003 338/53 |
| 8,081,465 B2 | 12/2011 | Nishiura | |
| 8,120,914 B2* | 2/2012 | Kajiura | H01L 23/473 361/689 |
| 9,578,789 B2* | 2/2017 | Uhlemann | H01L 23/473 |
| 9,657,997 B2* | 5/2017 | Fujita | H05K 7/20436 |
| 9,818,673 B2* | 11/2017 | Mizuno | F28F 3/025 |
| 10,488,122 B2 | 11/2019 | Vanderwees et al. | |
| 10,744,603 B2 | 8/2020 | Maehler et al. | |

(Continued)

FOREIGN PATENT DOCUMENTS

| RU | 194584 U1 | 9/2019 |
|---|---|---|
| WO | 2020125205 A1 | 6/2020 |

OTHER PUBLICATIONS

English translation of WO 2020/125205 Zhejiang Dunan Artificial Env Co Ltd Jun. 25, 2020.
English translation of RU 194584 Sep. 12, 2019.

*Primary Examiner* — Tho V Duong
(74) *Attorney, Agent, or Firm* — Ridout & Maybee LLP

(57) ABSTRACT

A heat exchanger assembly includes a cooling plate with at least one outer heat transfer surface adapted for thermal contact with one or more heat-generating substrates. A fluid flow path extends from an inlet port to an outlet port, with a plurality of cooling zones spaced apart along the fluid flow path, each cooling zone including a heat transfer element such as a corrugated fin sheet in contact with the inner surface of the first plate wall. Manifold spaces are defined proximate to the inlet and outlet ports, and between adjacent cooling zones. One or more bypass flow passages are provided between upstream and downstream ends of at least one cooling zone, to divert a portion of the heat transfer fluid from flowing through the cooling zone. The volume of fluid flow bypassing one or more cooling zones is calibrated to improve temperature uniformity of the heat-generating substrates.

12 Claims, 20 Drawing Sheets

(56) References Cited

U.S. PATENT DOCUMENTS

2006/0219396 A1* 10/2006 Abei ..................... H01L 25/117
                                                        257/E23.098
2010/0000717 A1    1/2010 Finck et al.
2010/0315780 A1* 12/2010 Murakami ............ H01L 23/473
                                                        361/699
2018/0252479 A1    9/2018 Kenney et al.

* cited by examiner

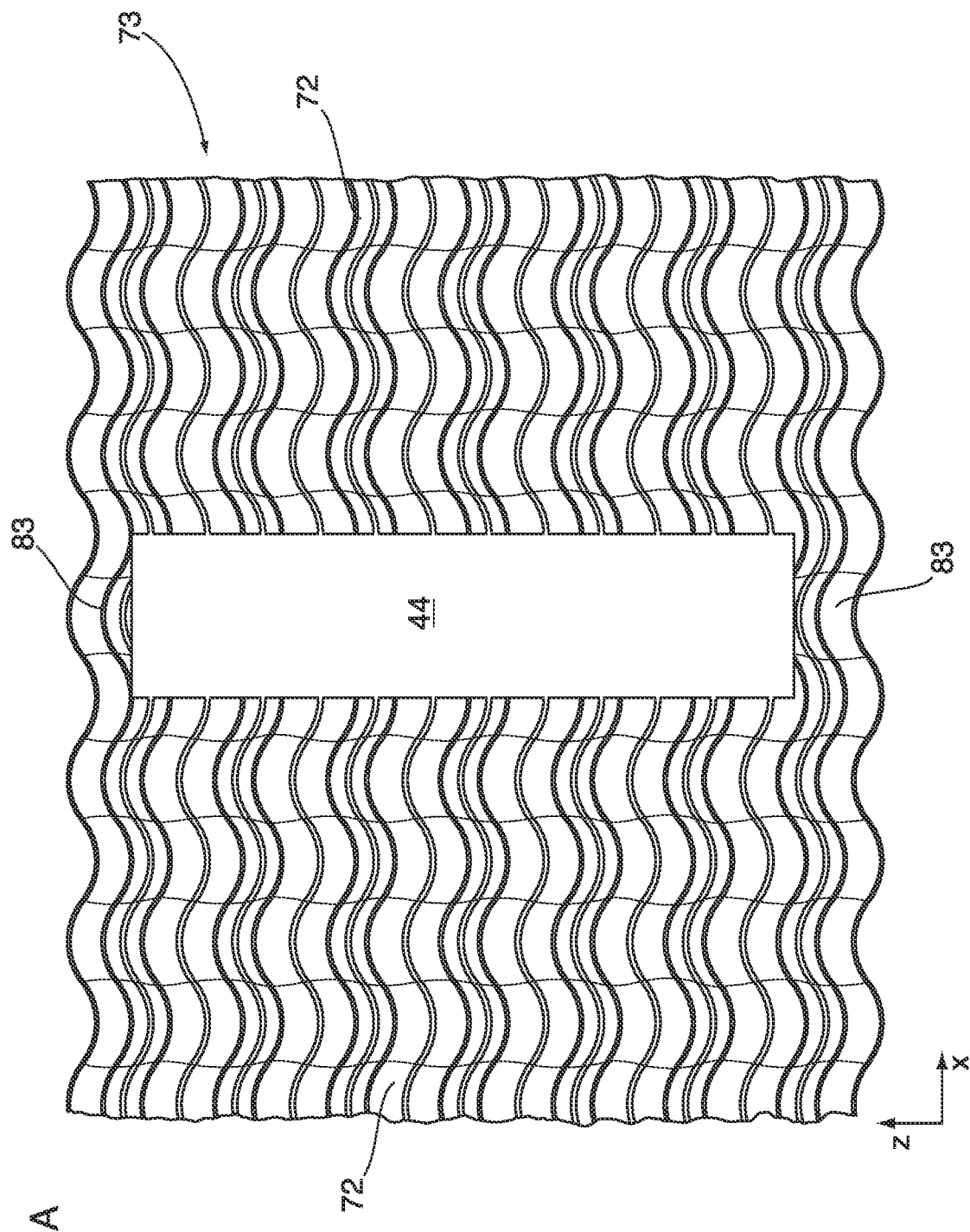

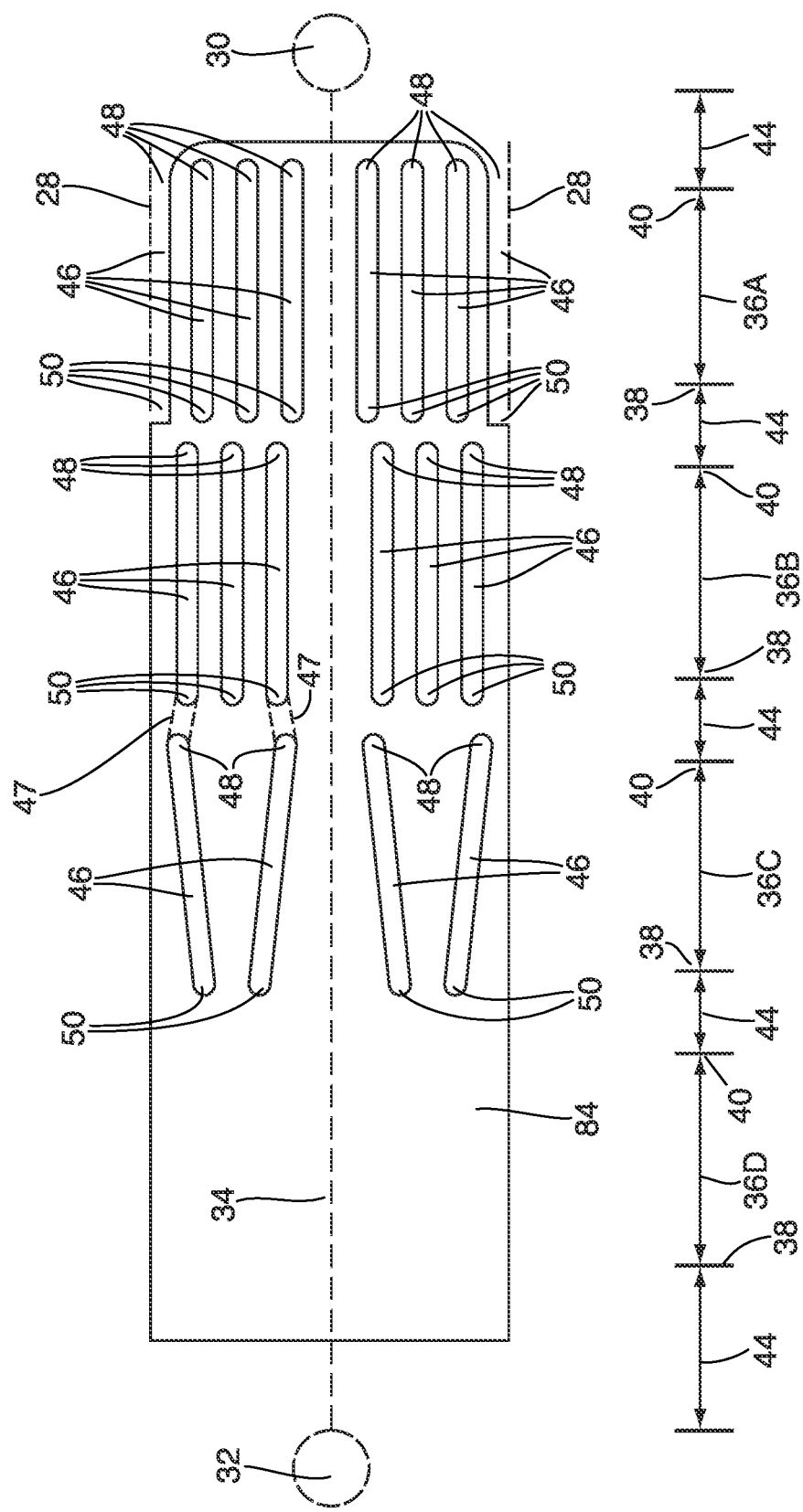

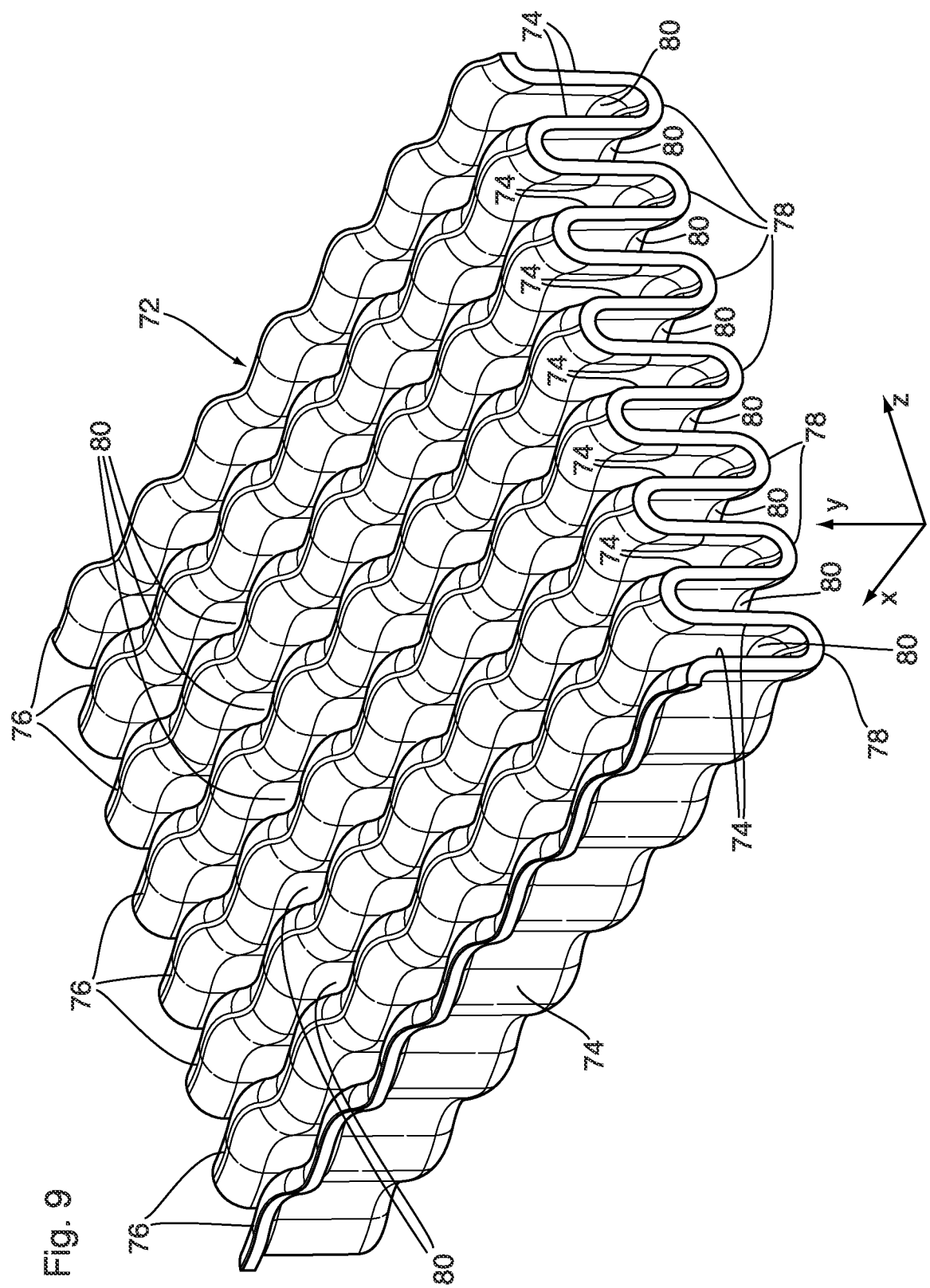

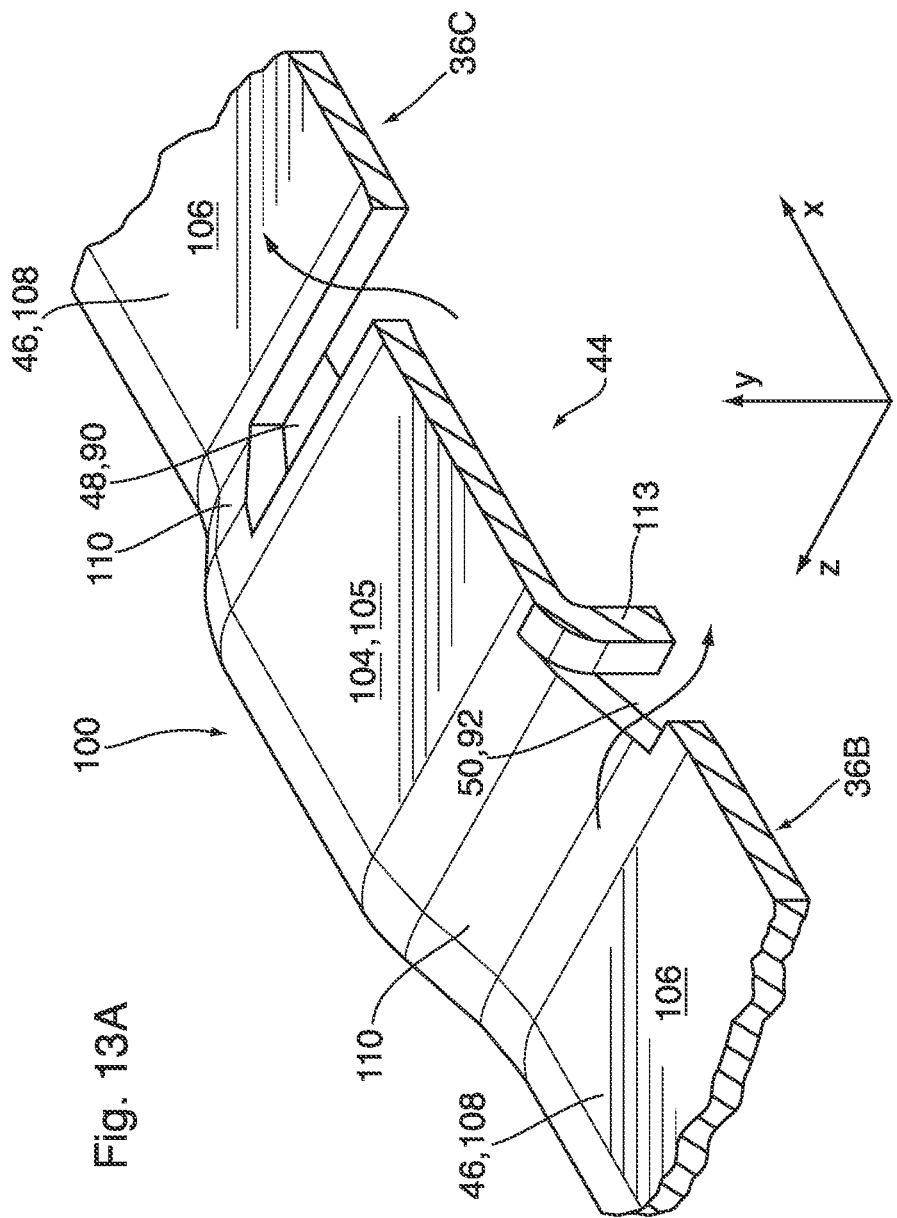

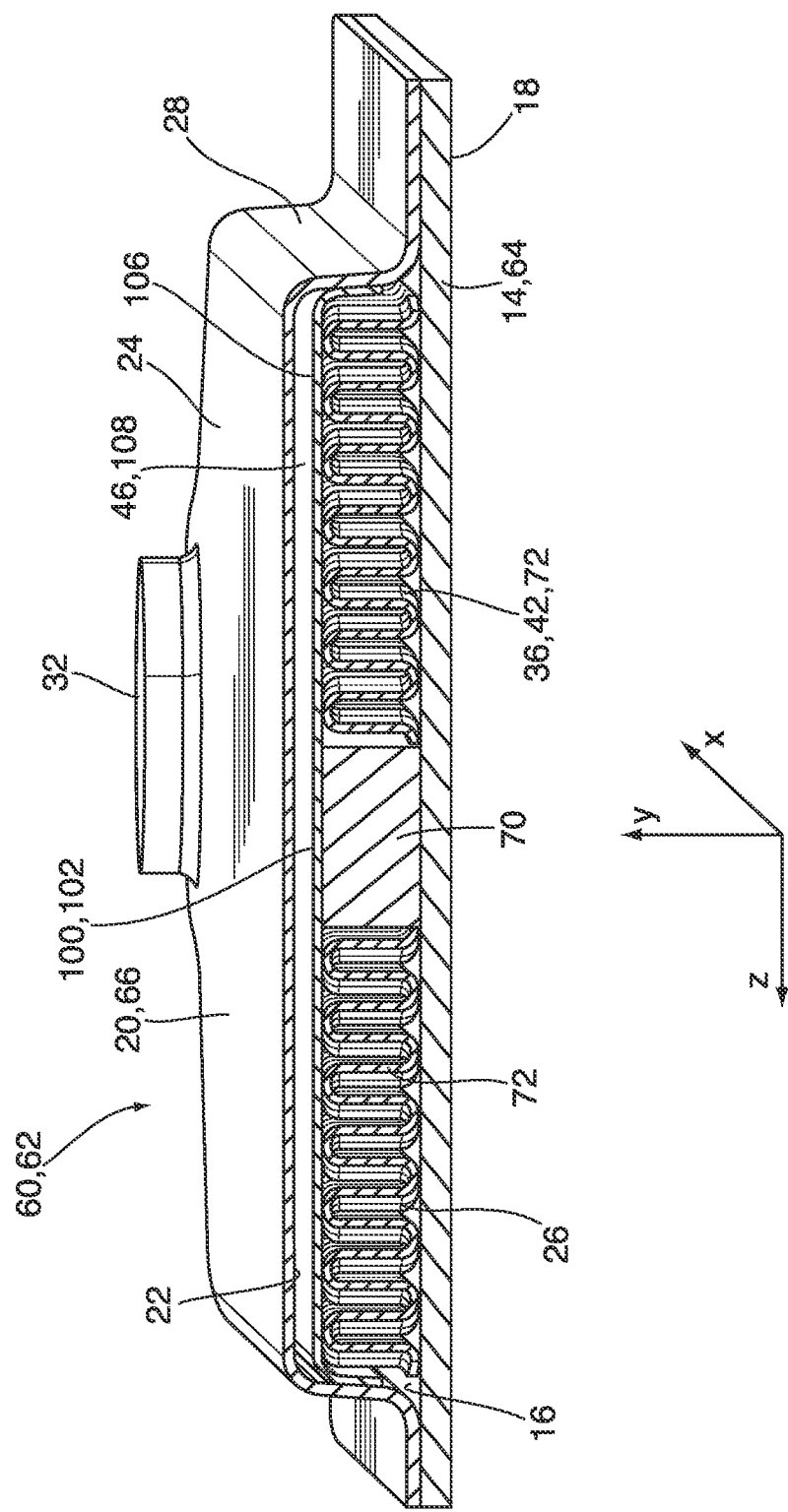

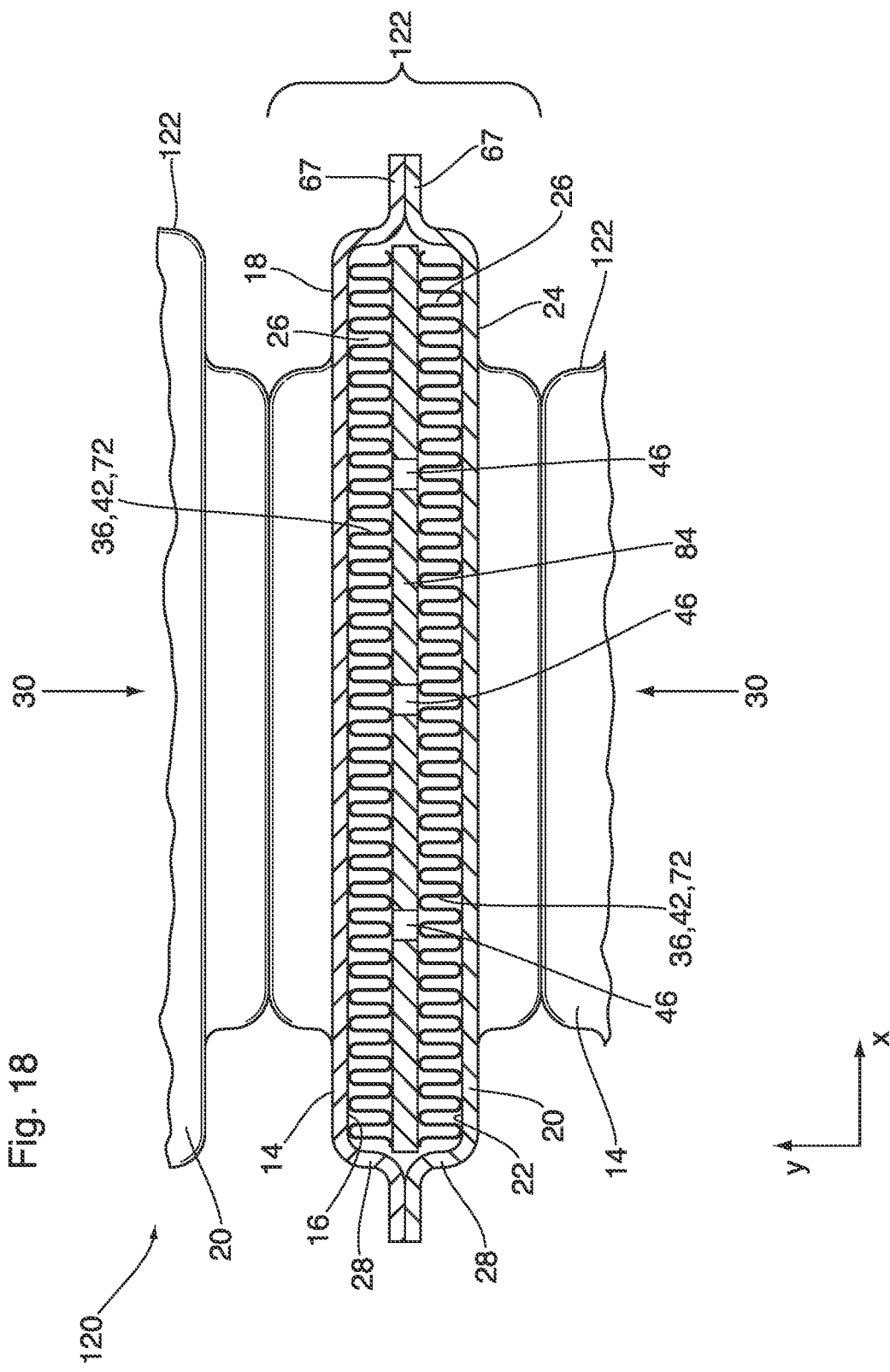

HIGH-PERFORMANCE HEAT EXCHANGER WITH CALIBRATED BYPASS

FIELD

The present disclosure relates to heat exchangers for cooling heat-generating substrates, and specifically for uniform cooling of one or more heat-generating substrates arranged along a fluid flow path of the heat exchanger.

BACKGROUND

Heat exchangers comprising one or more flat cooling plates are known for cooling heat-generating substrates for vehicles. For example, in electric and hybrid electric vehicles, cooling plates are used for cooling battery cells and power electronics devices. The heat energy generated by these heat-generating substrates must be dissipated to prevent them from overheating, becoming damaged, and/or having impaired performance.

A cooling plate typically comprises one or more internal fluid flow passages oriented along a fluid flow path between an inlet port and an outlet port. One or more heat-generating substrates are arranged in thermal contact with an outer surface of the cooling plate, and heat generated by the heat-generating substrates is transferred to the heat transfer fluid as it is circulated from the inlet port the outlet port. The temperature of the heat transfer fluid is therefore lower at the inlet than at the outlet and, as a result, the temperature of the heat-generating substrate closest to the outlet port may be higher than that of the heat-generating substrate closest to the inlet port. The magnitude of this temperature differential is a limiting factor on performance of the heat exchanger.

There is a need for a heat exchanger in which the temperature differential between the heat-generating substrates proximate to the inlet and outlet is minimized, without significantly increasing cost or complexity of the heat exchanger, and without significantly impairing performance of the heat exchanger.

SUMMARY

In an embodiment, there is provided a heat exchanger assembly comprising a cooling plate with an outer heat transfer surface adapted for thermal contact with one or more heat-generating substrates. The outer heat transfer surface has an area defined in a first plane, the cooling plate having a thickness defined in a second plane which is perpendicular to the first plane.

In an aspect, the cooling plate comprises: a first plate wall and a second plate wall spaced apart in the second plane, the first and second plate walls each having an inner surface and an outer surface, wherein the inner surfaces of the first and second plate walls face each other, and wherein the outer heat transfer surface is defined by the outer surface of the first plate wall. The cooling plate further comprises a hollow interior defined between the first and second plate walls; a fluid flow space defined in the hollow interior; an inlet port and an outlet port spaced apart in the first plane and in fluid communication with the fluid flow space, wherein a fluid flow path is defined in the fluid flow space from the inlet to the outlet; a plurality of cooling zones defined along the fluid flow path; and a plurality of manifold spaces in the hollow interior.

In an aspect, the cooling zones are spaced apart from one another along the fluid flow path, each cooling zone having an upstream end for receiving a heat transfer fluid flowing along the fluid flow path and a downstream end for discharging the heat transfer fluid along the fluid flow path, wherein each cooling zone comprises one or more heat transfer elements which are in contact with the inner surface of the first plate wall.

In an aspect, the plurality of manifold spaces include an inlet manifold space proximate to the inlet, an outlet manifold space proximate to the outlet, and at least one intermediate manifold space, each intermediate manifold space comprising a gap between the downstream end of one cooling zone and the upstream end of an adjacent cooling zone.

In an aspect, the cooling plate further comprises a bypass flow passage extending between the upstream and downstream ends of one cooling zone and adapted to divert a portion of the heat transfer fluid from flowing through the cooling zone, the bypass flow passage including at least one inlet opening at the upstream end of the cooling zone and at least one outlet opening at the downstream end of the cooling zone.

In an aspect, the at least one outlet opening of the bypass flow passage is in fluid communication with a manifold space at the downstream end of the cooling zone.

In an aspect, the at least one inlet opening of the bypass flow passage is in fluid communication with a manifold space at the upstream end of the cooling zone, and the at least one outlet opening of the bypass flow passage is in fluid communication with another manifold space at the downstream end of the cooling zone.

In an aspect, the cooling plate includes a plurality of bypass flow passages, and wherein an amount of bypass flow is different for different cooling zones, depending on the amount of cooling required in the different cooling zones.

In an aspect, the cooling plate includes a plurality of bypass flow passages, and wherein at least one bypass flow passage is provided for each of the cooling zones except for the cooling zone closest to the outlet opening, such that substantially all the heat transfer fluid flows through the cooling zone closest to the outlet opening.

In an aspect, at least one of cooling zones is provided with a plurality of bypass flow passages.

In an aspect, each heat transfer element comprises a corrugated fin sheet comprising a plurality of spaced sidewalls extending along the fluid flow path, and comprising top and bottom walls which join adjacent sidewalls together; wherein the top walls are in direct contact with the inner surface of the first plate wall, and the bottom walls are spaced from the inner surface of the second plate wall; and wherein the bypass flow passage is defined within a space between the bottom wall of a corrugated fin sheet and the inner surface of the second plate wall.

In an aspect, the cooling plate includes a plurality of bypass flow passages; wherein the cooling plate further comprises a diverter plate which is closely received within the fluid flow space, between the heat transfer elements and the inner surface of the second plate wall; and wherein the diverter plate comprises a plurality of slots, each of which defines one of the bypass flow passages, wherein each of the bypass flow passages has an inlet opening and an outlet opening located at opposite ends of one of the slots.

In an aspect, an orifice plate is sandwiched between the heat transfer elements and the diverter plate, wherein the orifice plate includes a plurality of spaced-apart inlet and outlet apertures, wherein each inlet aperture defines the inlet openings of one or more bypass flow passages, and each outlet aperture defines the outlet openings of one or more bypass flow passages.

In an aspect, at least one of the inlet apertures of the orifice plate comprises a protrusion which protrudes into one of the manifold spaces and has a protrusion facing in an upstream direction to receive the heat transfer fluid flowing along the fluid flow path.

In an aspect, the cooling plate includes a plurality of bypass flow passages; wherein the inner surface of the second plate wall comprises a plurality of grooves, each of which defines one of the bypass flow passages, wherein each of the bypass flow passages has an inlet opening and an outlet opening defined at opposite ends of one of the grooves.

In an aspect, the second plate wall forms part of an embossed plate, and wherein the grooves comprise rib-like embossments formed in the second plate wall.

In an aspect, the cooling plate includes a plurality of bypass flow passages and further comprises a diverter plate which is closely received within the fluid flow space, between the heat transfer elements and the inner surface of the second plate wall. The diverter plate comprises a plurality of transverse ribs, each having a raised upper surface in sealed engagement with the inner surface of the second plate wall, wherein the locations of ribs correspond to the locations of the manifold spaces in the fluid flow space; wherein the diverter plate further comprises reduced-height plate areas between the transverse ribs, and separated from one another by the transverse ribs; wherein the reduced-height plate areas are in contact with the heat transfer elements and wherein each of the reduced-height plate areas is spaced from the inner surface of the second plate wall by a spacing gap; and wherein at least one of the spacing gaps defines one of the bypass flow passages.

In an aspect, at least one of the bypass flow passages includes a plurality of inlet openings; wherein each of the plurality of inlet openings comprises an aperture in the diverter plate, providing flow communication between the spacing gap and one of the manifold spaces; and wherein the plurality of inlet openings of at least one of the bypass flow passages is formed in an upstream-facing sidewall of one of the transverse ribs.

In an aspect, the diverter plate has downturned longitudinal edges which are adapted to seal against a peripheral longitudinal sidewall of the cooling plate to minimize bypass flow between the peripheral sidewall and longitudinal outer edges of the heat transfer elements.

In an aspect, at least one of the bypass flow passages includes a plurality of outlet openings; and each of the plurality of outlet openings comprises a groove extending along the fluid flow path across the top surface of one of the transverse ribs; wherein each of the grooves provides fluid communication between a pair of spacing gaps which are separated by the transverse rib in which the groove is provided.

In an aspect, at least one of the bypass flow passages includes a plurality of outlet openings; and each of the plurality of outlet openings comprises an aperture in the diverter plate, providing flow communication between the spacing gap and one of the manifold spaces.

In an aspect, the plurality of outlet openings of at least one of the bypass flow passages is formed in a downstream-facing sidewall of one of the transverse ribs.

In an aspect, the above-mentioned cooling zones and manifold spaces are the first cooling zones and first manifold spaces, respectively, and the cooling plate further comprises second cooling zones and second manifold spaces. The second cooling zones are spaced apart from one another along the fluid flow path Each second cooling zone has an upstream end for receiving a heat transfer fluid flowing along the fluid flow path and a downstream end for discharging the heat transfer fluid along the fluid flow path, and each second cooling zone comprises one or more heat transfer elements in contact with the inner surface of the second plate. The second manifold spaces include an inlet manifold space proximate to the inlet, an outlet manifold space proximate to the outlet, and at least one intermediate manifold space, each intermediate manifold space comprising a gap between the downstream end of one second cooling zone and the upstream end of an adjacent second cooling zone. The second cooling zones and the second manifold spaces are sandwiched between the bypass flow passage and the inner surface of the second plate wall.

BRIEF DESCRIPTION OF DRAWINGS

The invention will now be described, by way of example only, with reference to the accompanying drawings in which:

FIG. 7A is a top plan view of corrugated fin sheets according to a variant of the heat exchanger assembly of FIG. 4;

FIG. 8 is a plan view of the bypass plate of the heat exchanger assembly of FIG. 4;

FIG. 9 is a perspective view of a corrugated fin of the heat exchanger assembly of FIG. 4;

FIG. 13A is a close-up, longitudinal cross section through a portion of the diverter plate of FIG. 13;

FIG. 14 is a transverse cross section along line 14-14' of FIG. 13, showing a cooling plate incorporating the diverter plate of FIG. 13;

FIG. 18 shows a transverse cross-section through a two-sided cooling plate.

DETAILED DESCRIPTION

The example embodiments described herein relate to heat exchangers for cooling heat-generating substrates such as power electronics substrates for battery or hybrid electric vehicles. These power electronics substrates may include transistors, resistors, capacitors, field effect transistors (FETS), isolated gate bipolar transistors (IGBTs), power inverters, DC to DC converters, DC to AC converters, or combinations thereof. However, it will be appreciated that the heat exchangers described herein may be used for cooling other heat-generating substrates in conventional or electric vehicles, such as battery cells.

The heat exchanger assemblies described herein comprise at least one generally flat, planar cooling plates having opposed outer surfaces, at least one of which is adapted for thermal contact with one or more heat-generating substrates. In some embodiments, the heat exchanger assembly may comprise two or more cooling plates which are fluidly connected together.

Figure 1:
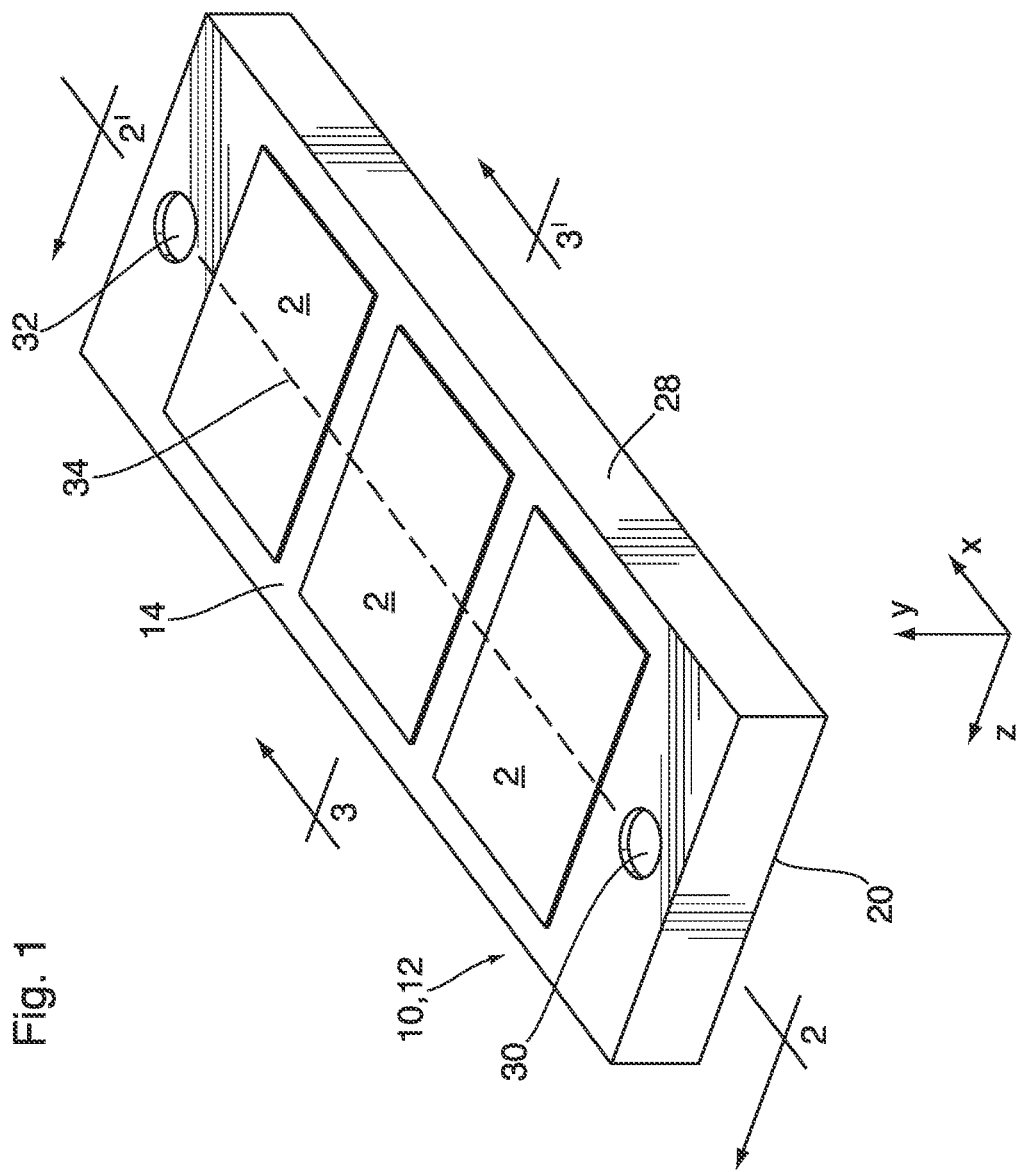
FIG. 1 is a top perspective view of a heat exchanger assembly according to an embodiment.

A heat exchanger assembly 10 according to an embodiment is described below with reference to FIGS. 1 to 3.

The heat exchanger assembly 10 comprises a cooling plate 12 which is generally flat and planar, in the form of a flat elongate tube, having an area in a first plane (xz plane) and a thickness in a second plane (yz plane), the thickness of cooling plate 12 being relatively small in comparison to its width and length. The cooling plate 12 comprises a first plate wall 14 having an inner surface 16 and an opposite outer surface 18, and a second plate wall 20 having an inner surface 22 and an outer surface 24. As further discussed below, the outer surface 18 of the first plate wall 14 is adapted for thermal contact with one or more heat-generating substrates 2, and is also referred to herein as the outer heat transfer surface.

The first and second plate walls 14, 20 are generally flat and parallel to each other, and spaced apart in the thickness dimension of the cooling plate 10. A fluid flow space 26 for circulation of a heat transfer fluid is defined between the inner surfaces 16, 22 of the first and second plate walls 14, 20, and is enclosed at its outer peripheral edges by a peripheral sidewall 28 which connects the first and second plate walls 14, 20.

The cooling plate 10 further comprises an inlet port 30 and an outlet port 32 spaced apart in the first plane and in fluid communication with the fluid flow space 26. In the present embodiment, the inlet and outlet ports 30, 32 each comprise apertures in the first plate wall 14, however, it will be appreciated that the inlet and outlet ports 30, 32 may have different configurations. For example, one or both of the inlet and outlet ports 30, 32 may instead be formed in the second plate wall 20 or in the sidewall 28. Alternatively, the inlet and outlet ports 30, 32 may comprise through-openings formed through both the first and second plate walls 14, 20. Although not shown in FIGS. 1-3, the inlet and outlet ports may be provided with fittings for connection to fluid conduits and/or other cooling plates.

A fluid flow path 34 is defined through the fluid flow space 26 from the inlet port 30 to the outlet port 32, and defines the overall flow direction of the heat transfer fluid through the cooling plate 10. In the present embodiment, the inlet and outlet ports 30, 32 are located at opposite ends of the cooling plate 10, and the fluid flow path 34 is linear, extending longitudinally (along the x-axis). However, in some embodiments, the fluid flow path 34 may be U-shaped, with the inlet and outlet ports 30, 32 located at the same end of the cooling plate 10. In other embodiments, the fluid flow path 34 may be serpentine, with the inlet and outlet ports 30, 32 located at the same end or different ends of the cooling plate 10.

A plurality of cooling zones 36 are defined along the fluid flow path 34. Due to the linear nature of the fluid flow path 34, the cooling zones 36 are in a linear arrangement. The cooling zones 36 define specific areas in which heat is transferred from the one or more heat-generating substrates 2 located outside the cooling plate 10, to the heat transfer fluid flowing through the fluid flow space 26 inside the cooling plate 10. In the present embodiment, the cooling plate 10 includes three cooling zones 36, each corresponding at least approximately in shape and area to a heat-generating substrate 2 which is in thermal contact with the outer heat transfer surface 18.

The cooling zones 36 are spaced apart from one another along the fluid flow path 34, as are the heat-generating substrates 2. Each cooling zone 36 has an upstream end 38 and an opposite downstream end 40. The upstream end 38 is adapted for receiving the heat transfer fluid as it flows along the fluid flow path 34, and the downstream end 40 is adapted for discharging the heat transfer fluid along the fluid flow path 34. For example, the cooling zone 36 closest to the inlet port 30 receives relatively cool heat transfer fluid from the inlet port 30 and discharges it to an intermediate cooling zone 36. The cooling zone 36 closest to the outlet port 32 receives relatively warm heat transfer fluid from an adjacent cooling zone 36 and discharges it to the outlet port 32. Therefore, where the cooling plate 10 includes multiple similar cooling zones 36 arranged in series, heat is added to the fluid as it passes through each cooling zone 36, such that the temperature of the heat transfer fluid increases as it flows along the fluid flow path 34.

Figure 2:
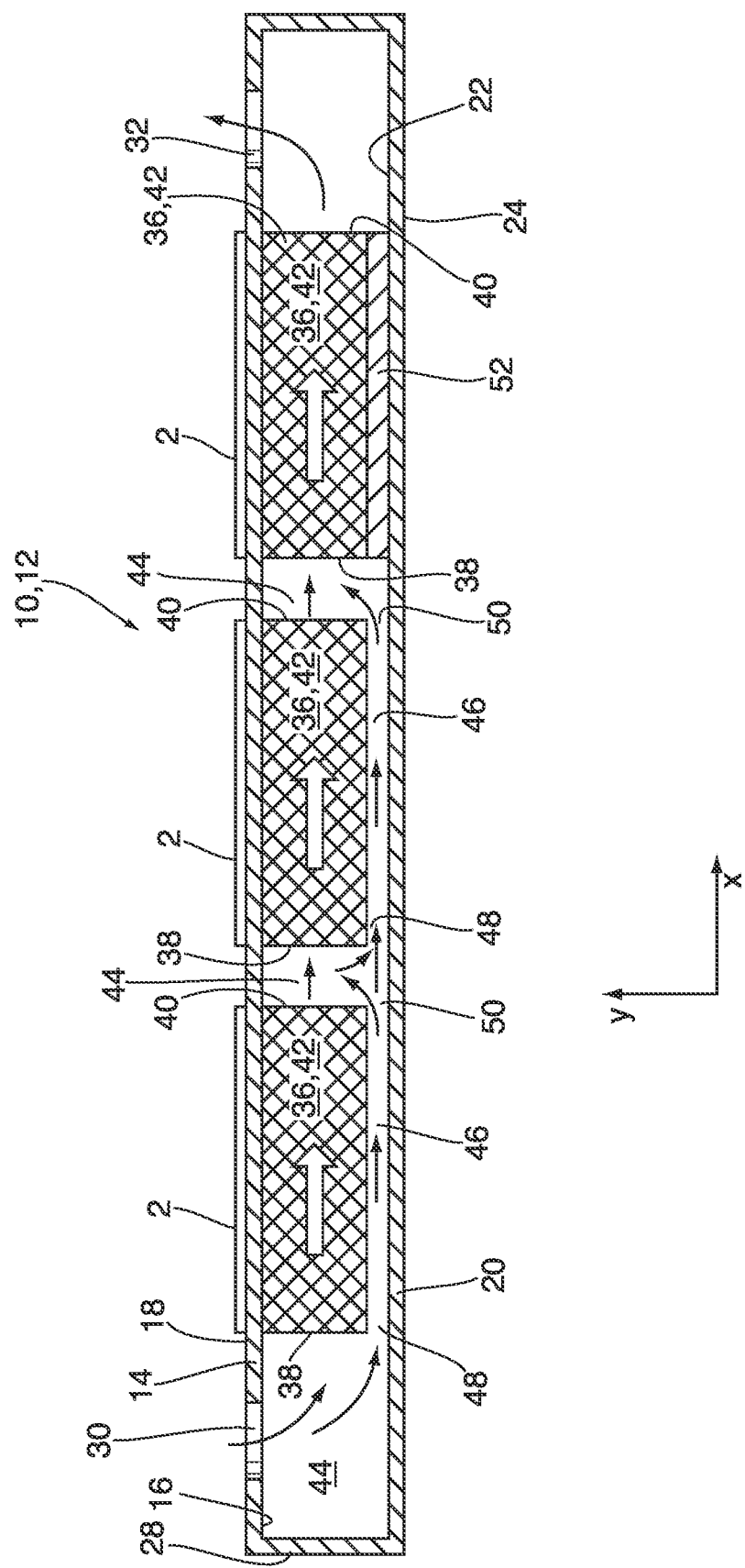
FIG. 2 is a longitudinal cross-section through the heat exchanger assembly of FIG. 1, along line 2-2' of FIG. 1.
Figure 3:
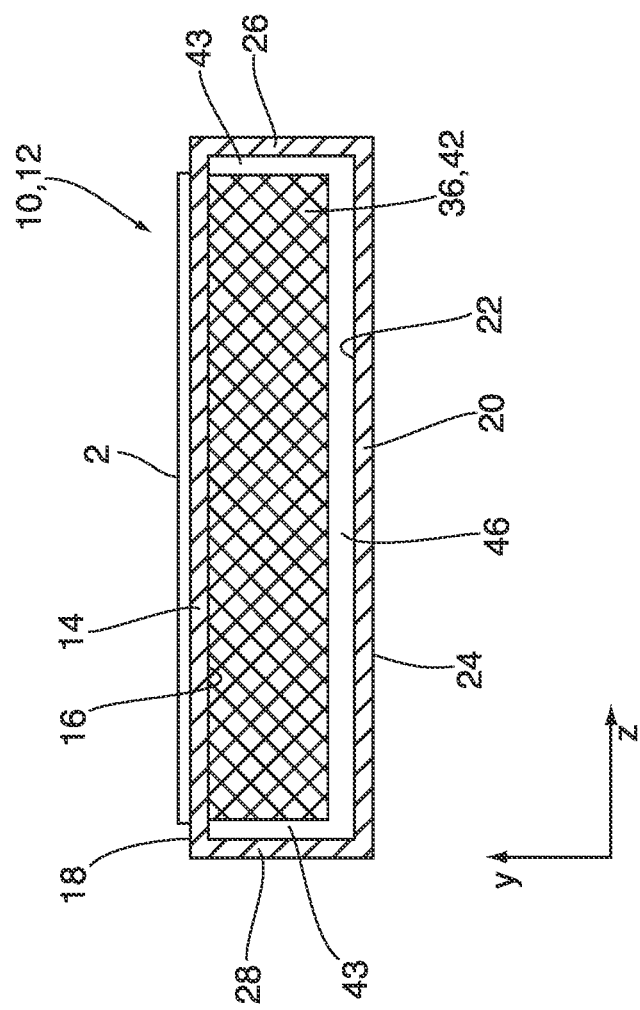
FIG. 3 is a transverse cross-section through the heat exchanger assembly of FIG. 1, along line 3-3' of FIG. 1.

Each of the cooling zones 36 comprises one or more heat transfer elements 42 (indicated by cross-hatching in FIGS. 2-3). These heat transfer elements 42 are in contact with the inner surface 16 of the first plate 14 and extend into the fluid flow space 26, to provide a continuous path for conduction of heat from the outer surface 18 of the first plate 14 to the heat transfer fluid flowing through the fluid flow space 26. In some embodiments, the heat transfer elements 42 may be metallurgically bonded to the inner surface 16 of the first plate, to enhance thermal conduction. In addition to providing a continuous path for heat conduction, the heat transfer elements 42 provide increased surface area for heat transfer and may also provide increased turbulence within the flow of heat transfer fluid, to further enhance heat transfer.

The heat transfer elements 42 may be integrally formed with one or both of the plate walls 14, 18 or may comprise separately formed elements which are placed within the fluid flow space 26. For example, the heat transfer elements 42 may comprise protrusions which are integrally formed with the first plate 14, or which are formed on one or more sheets or plates inserted into the fluid flow space 26. Such protrusions may take the form of dimples, ribs or blade-like fins. In some embodiments, the heat transfer elements 42 of each cooling zone 36 may comprise one or more separately formed corrugated fin sheets, which are located within the fluid flow space 26, which are in direct contact with the inner surface 16 of first plate 14 and may be metallurgically bonded thereto, and which define the shape and area of that cooling zone 36.

The cooling plate 10 is configured to minimize bypass flow between the outer longitudinal edges (along x-axis) of the cooling zones 36 and the sidewalls 28 of the cooling plate 10. Such bypass flow impairs heat exchanger performance since it provides a direct path for fluid flow from the inlet port 30 to the outlet port 32, without passing through any of the cooling zones 36. In the present embodiment, relatively narrow bypass flow passages 43 are shown in FIG. 3 between the sidewalls 28 and the outer longitudinal edges of the heat transfer elements 42 of each cooling zone 36. It is desirable that the cooling zones 36 and heat transfer elements 42 extend as close as possible to the sidewalls 28 to minimize bypass flow through passages 43.

A plurality of manifold spaces 44 are provided in the fluid flow space 26. These manifold spaces 44 allow for fluid distribution and/or fluid mixing upstream and downstream of each of the cooling zones 36, i.e. at the upstream and downstream ends 38, 40 of each cooling zone 36. One of the manifold spaces 44 is proximate to the inlet port 30 and the upstream end of the cooling zone 36 closest thereto, and is referred to herein as the "inlet manifold space" 44. Another of the manifold spaces 44 is proximate to the outlet port 32 and the downstream end of the cooling zone 36 closest thereto, being referred to herein as the "outlet manifold space" 44.

The cooling plate 10 also includes at least one intermediate manifold space 44, being located between the downstream end 40 of one cooling zone 36 and the upstream end 38 of an immediately adjacent cooling zone 36. Because cooling plate 10 includes three cooling zones 36, there are two intermediate manifold spaces 44. It will be appreciated that in a cooling plate 10 with n cooling zones 36, there will be n–1 intermediate manifold spaces 44. The intermediate manifold spaces 44 comprise gaps which correspond at least approximately to spaces between adjacent heat-generating substrates 2.

The manifold spaces 44 correspond to areas in which there is reduced heat transfer to the heat transfer fluid, and the manifold spaces generally do not contain heat transfer elements 42. In the present embodiment, the manifold spaces 44 are empty spaces through which the heat transfer fluid may flow unimpeded.

The cooling plate 10 further comprises at least one bypass flow passage 46. Each bypass flow passage 46 extends between the upstream and downstream ends 38, 40 of one of the cooling zones 36. One or more bypass flow passages 46 may be provided for any given cooling zone 36, however, not every cooling zone 36 necessarily includes a bypass flow passage 46. For example, cooling plate 10 includes two bypass flow passages 46 diverting fluid flow from the cooling zone 36 closest to the inlet port 30; one bypass flow passage 46 diverting flow from the intermediate cooling zone 36; and no bypass flow passages 46 for the cooling zone 36 closest to the outlet port 32.

Each bypass flow passage 46 includes at least one inlet opening 48 for receiving heat transfer fluid and at least one outlet opening 50 for discharging the heat transfer fluid. At least the outlet openings 50 are in fluid communication with the manifold spaces 44. In the present embodiment, both the inlet openings 48 and the outlet openings 50 are in fluid communication with the manifold spaces 44. In particular, for each bypass flow passage 46 in the present embodiment, the at least one inlet opening 48 is in fluid communication with a manifold space 44 at the upstream end 38 of a cooling zone 36, and the at least one outlet opening 50 is in fluid communication with a manifold space 44 at the downstream end 40 of the same cooling zone 36.

In the present embodiment, heat transfer fluid passing through the manifold space 44 at the upstream end 38 of each cooling zone 36 will have two possible paths. A first portion of the fluid will enter the cooling zone 36 to absorb heat from the heat-generating substrate 2, and a second portion of the fluid will enter the bypass flow passage(s) 46 through the inlet opening(s) 48. After passing through the bypass flow passage(s) 46, the second portion of the fluid is discharged through the outlet opening(s) 50 into the manifold space 44 at the downstream end 40, to mix with the first portion of the fluid discharged from the cooling zone 36. The relative proportions of fluid flowing through the cooling zone 36 and the bypass flow passage(s) 46 depends on the number and area of the inlet and/or outlet openings 48, 50, the number and area of the bypass flow passage(s) 46, and the relative pressure drop of the bypass flow passage(s) 46 and the heat transfer elements 42. For example, where the resistance to fluid flow through the heat transfer elements 42 is relatively high, more fluid will flow through the bypass flow passage(s) 46.

As shown in FIGS. 2 and 3, each bypass flow passage 46 is spaced apart from the first plate 14 which is in thermal contact with the heat-generating substrates 2. In particular, each bypass flow passage 46 is located between a cooling zone 36 and the inner surface 22 of the second plate 20, and may be located along the inner surface 22 of second plate 20. As further described below, the bypass flow passages 46 may be integrally formed with the second plate 20 or may be part of a separately-formed element, such as one or more plates as described below.

Providing bypass flow passages 46 at one or more of the cooling zones 36 allows temperature balancing of the heat-generating substrates 2, as described below. In comparison to an identical cooling zone 36 which lacks bypass flow passage(s) 46, the second portion of the heat transfer fluid flowing through the bypass flow passage(s) 46 is relatively cooler, and the first portion of the heat transfer fluid flowing through the heat transfer element 42 is relatively hotter. The first and second portions of the heat transfer fluid are then mixed in the manifold space 44 which is downstream of the cooling zone 36, the temperature of the mixed fluid being about the same as that of an identical cooling zone 36 without bypass flow passage(s) 46. This mixed fluid stream is fed to the next cooling zone 36 along the fluid flow path 34.

Because the first portion of the heat transfer fluid in the cooling zones 36 with bypass flow passages 46 is relatively hotter, the heat-generating substrates 2 on top of these cooling zones 36 will be relatively hotter, as compared to an identical cooling zone 36 without bypass flow passage(s) 46. By calibrating the amount of fluid bypassing one or more cooling zones 36, it is possible to reduce the temperature differential between the heat-generating substrates 2 located in different areas of cooling plate 10. In the present embodiment, this means that the heat-generating substrate 2 on top of the cooling zone 36 closest to the inlet port 30 will be relatively hotter, and the heat-generating substrate 2 on top of the cooling zone 36 closest to the outlet port 32 will be relatively cooler 32, as compared to an equivalent cooling plate 10 lacking bypass flow passages 46.

By calibrating the relative volumes of the first and second portions of the heat transfer fluid flowing through the respective cooling zones 36 and bypass flow passage(s) 46, it is possible to minimize the temperature differential between the heat-generating substrate 2 closest to the inlet port 30 and the heat-generating substrate closest to the outlet port 32, thus improving performance of the cooling plate 10 for a given pressure drop. Of course the temperature balancing depends on a number of parameters, including the relative amounts of heat generated by the heat-generating substrates 2, which is not necessarily the same. In some embodiments, it may be desirable to minimize bypass flow in another one of the cooling zones 36, either instead of or in addition to minimizing bypass flow in the cooling zone 36 immediately adjacent to the outlet port 32. This may arise, for example, where the cooling zone 36 immediately adjacent to the outlet port 32 has a lower thermal input than one or more of the other cooling zones 36, and/or the heat-generating substrate 2 closest to the outlet port 32 is able to withstand a higher temperature than one or more of the other heat-generating substrates 2.

The presence of bypass flow passages 46 also has an impact on the total pressure drop between the inlet port 30 and the outlet port 32. In this regard, there is a lower resistance to fluid flow through the bypass flow passage(s) 46, as compared to the resistance of fluid flow through the cooling zones 36, due to the presence of the heat transfer elements 42 in the cooling zones 36. The total pressure drop through the cooling plate 10 is reduced as the amount of fluid flow through the bypass flow passage(s) 46 increases. This reduction in overall pressure drop can be significant, and allows one to increase the density/performance of the heat transfer elements 42 in all the cooling zones 36, to reduce the temperatures of the heat-generating substrates 2.

It can be seen from the above discussion that the bypass flow passages 46 have an impact on fluid temperature and pressure drop. It can also be seen that calibrating the amount and location of bypass flow in cooling plate 10 and adjusting the performance of heat transfer elements 42, allows one to reduce the maximum temperature of the heat-generating substrates 2, and to reduce the temperature differentials between the heat-generating substrates 2 located on different areas of the cooling plate 10.

In heat exchanger design, heat transfer performance is balanced with pressure drop. As a properly designed heat transfer surface becomes more effective, more pressure drop in the working fluid is required. There is generally a preference to keep all cooling zones (and the corresponding heat-generating substrates) at or about the same temperature, for reasons of durability, uniformity of performance, etc. The embodiments described herein allows for all cooling zones 36 to operate at or close to a uniform temperature by reducing the effective amount of heat transfer fluid flowing through cooling zones 36 which, in conventional cooling plates of this type, would be at a lower temperature. This reduction in flow through a specific cooling zone 36 is achieved by providing a low pressure drop bypass of some fluid around the cooling zone 36, through one or more bypass flow passages 46. This reduces the pressure drop for the specific cooling zone 36 and the overall pressure drop of the cooling plate 10. Performance of the entire cooling plate 10 can then be enhanced by changing the design of the heat transfer elements 42, by increasing their heat transfer performance and their pressure drop. As a result, the performance of the cooling plate 10 can be enhanced, while the pressure drop of the enhanced cooling plate 10 remains about the same as that of a similar cooling plate without a calibrated bypass.

The beneficial bypass flow through passages 46 is to be contrasted with the undesirable bypass flow around the outer edges of the cooling zones 36. In this regard, passages 46 offer only a "partial" bypass, since the fluid flowing through passages 46 is eventually forced to flow through at least one cooling zone 36 as it passes from the inlet port 30 to the outlet port 32. In contrast, the bypass flow passages 43 (FIG. 3) around the outer edges of the cooling zones 36 provide a direct path for the fluid to flow from the inlet to the outlet, without passing through any of the cooling zones 36.

It may be advantageous to provide a higher volume of bypass flow for the cooling zones 36 closest to the inlet port 30, and to decrease the volume of bypass flow toward the outlet port 32. For example, as shown in cooling plate 10, there may be no bypass flow passage 46 permitting fluid to bypass the cooling zone 36 closest to the outlet port 32. In this, regard, FIG. 2 shows that a block or plate 52 is provided in the space between heat transfer element 42 and the inner surface 22 of second plate 20. Therefore, substantially all the heat transfer fluid passes through the heat transfer element 42 in this cooling zone 36. However, as discussed above, the locations of bypass flow passages 46 will depend somewhat on the relative cooling needs of the different heat-generating substrates 2, and the configuration shown in FIGS. 1-3 may be useful where each of the heat-generating substrates 2 generate similar amounts of heat energy.

A heat exchanger assembly 60 according to an embodiment is now described with reference to FIGS. 4 to 7, 7A, 8 and 9. Heat exchanger assembly 60 includes many of the same elements as heat exchanger 10, which are identified with like reference numerals. The above descriptions of these like-numbered elements apply equally to heat exchanger assembly 100.

Heat exchanger assembly 60 comprises a cooling plate 62 which is generally flat and planar, comprising a flat elongate tube comprising first and second plate walls 14, 20 as described above. The first plate wall 14 comprises a flat heat sink plate 64 with flat, planar inner and outer surfaces 16, 18, wherein the flat outer surface 18 supports a plurality of heat-generating substrates 2.

Heat exchanger assembly 60 includes an embossed plate 66 which comprises the second plate wall 20 and the peripheral sidewall 28. The embossed plate 66 is formed from a flat plate or sheet by stamping or drawing. The peripheral sidewall 28 rises up from the second plate wall 20 and terminates in an outwardly extending peripheral flange 67 defining a sealing surface adapted to form a fluid-tight seal against the inner surface 16 of the first plate wall 14 (heat sink plate 64), for example by brazing. In the present embodiment, the heat sink plate 64/first plate wall 14 is thicker than the embossed plate 66/second plate wall 20. The inlet and outlet port 30, 32 are both formed in the second plate wall 20 of embossed plate 66, inwardly of the peripheral sidewall 28.

Figure 4:
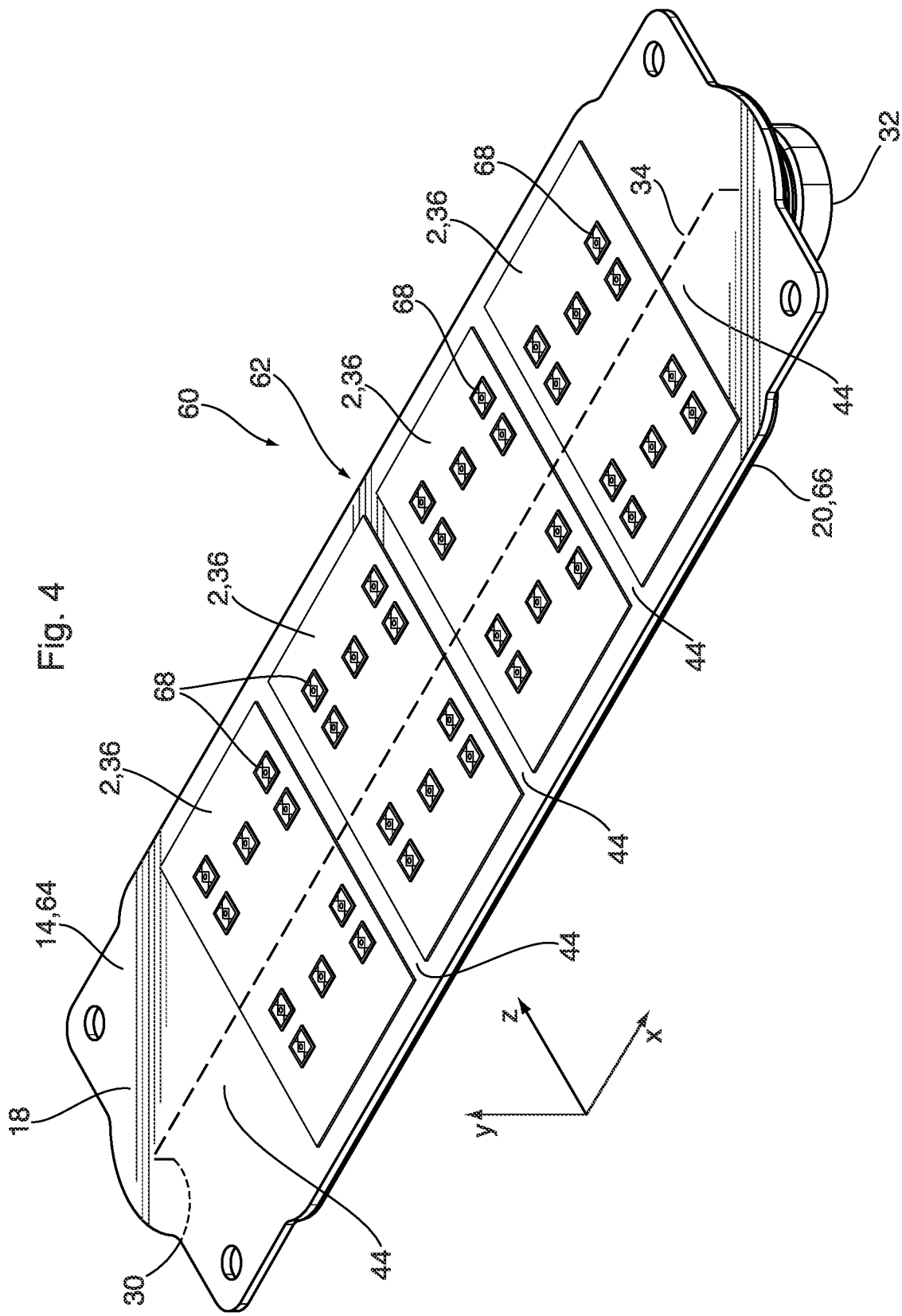
FIG. 4 is a top perspective view of a heat exchanger assembly according to an embodiment.
Figure 5:
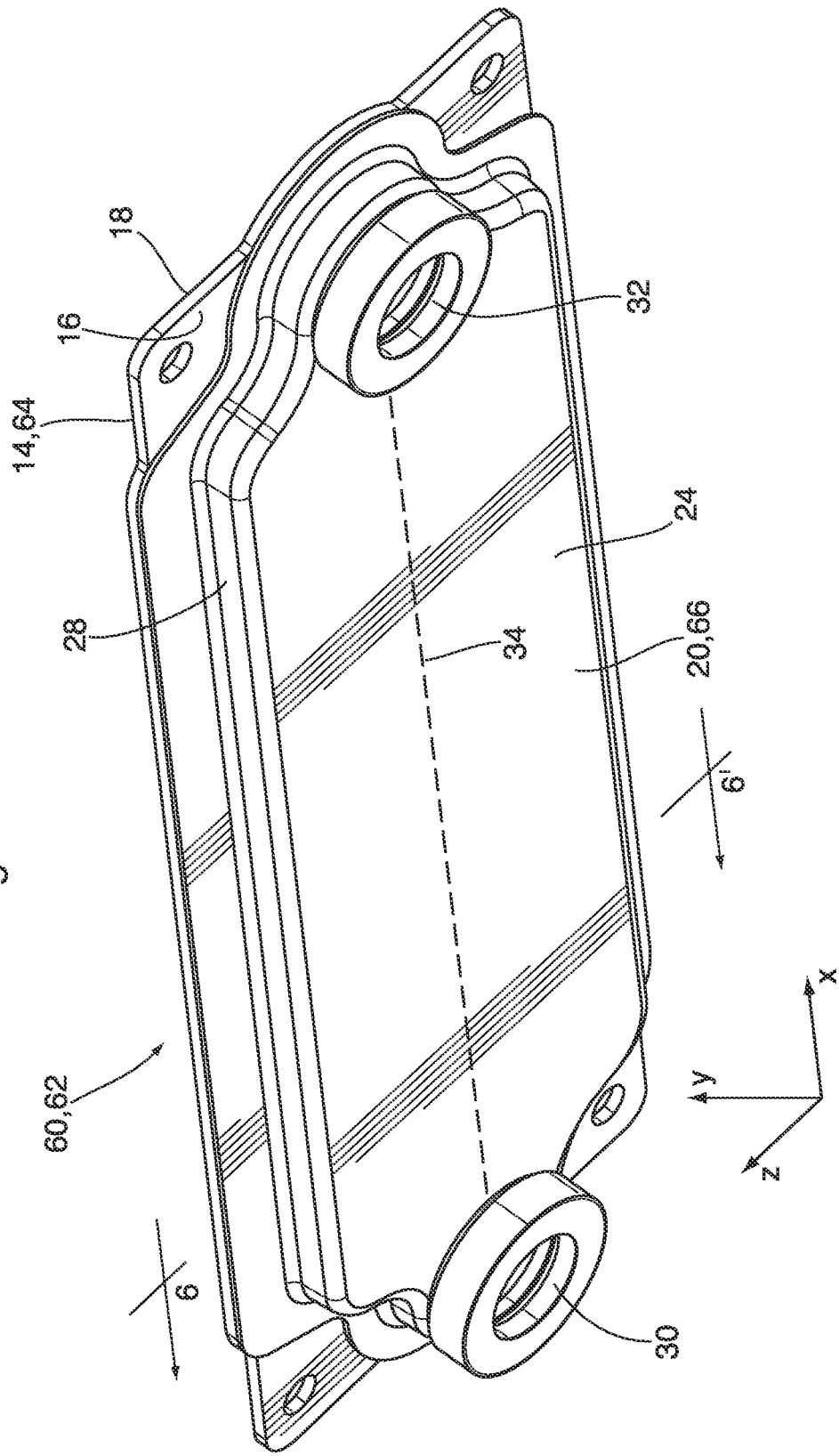
FIG. 5 is a bottom perspective view of the heat exchanger assembly of FIG. 4.
Figure 6:
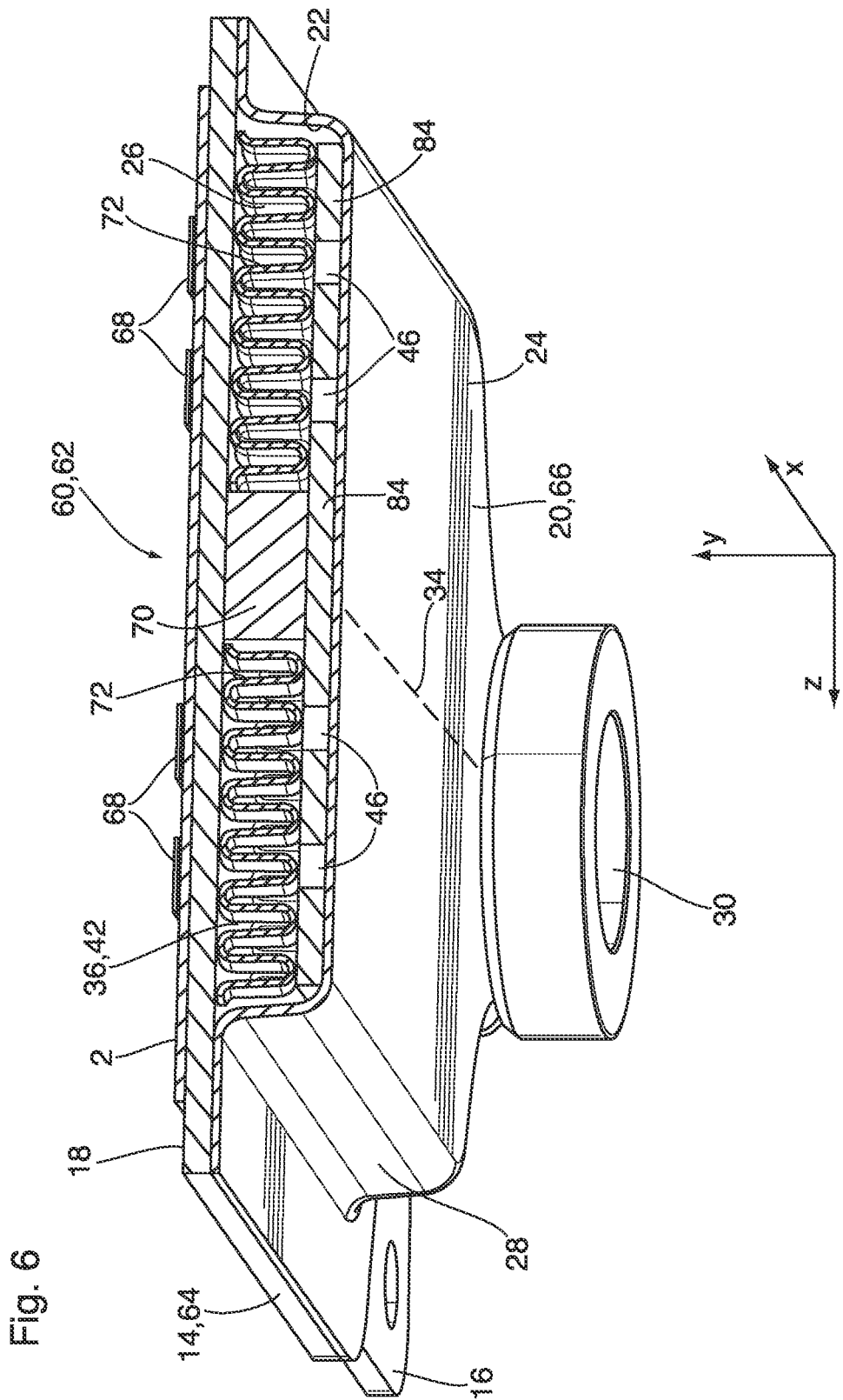
FIG. 6 is a transverse cross section along line 6-6' of FIG. 5.

As shown in FIG. 4, four heat-generating substrates 2 are supported on, and in thermal contact with, the outer surface 18 of first plate wall 14, although this number of heat-generating substrates 2 is exemplary only. The heat-generating substrates 2 are spaced apart and are arranged in a linear manner along the fluid flow path 34 (indicated by a dashed line), between inlet and outlet ports 30, 32. Each of the heat-generating substrates 2 may comprise a power electronics device including one or more heat-generating components 68, which may include electronic components such as gate drivers, semi conductor devices, switches, transistors, etc. The heat-generating components 68 are responsible for most or all of the heat generated by the heat-generating substrates 2. Some of the heat produced by components 68 spreads throughout the area of substrate 2, however, components 68 may comprise hot spots within the area of substrates 2. Although only a few of the heat-generating components 68 are identified in FIG. 4, all four heat-generating substrates 2 are shown as having ten components 68, and may all produce similar amounts of heat, however this is not essential. It will be appreciated that the number and arrangement of heat-generating components 68 incorporated into the heat-generating substrates 2 is variable, and that different heat-generating substrates 2 may include different numbers of heat-generating components 68 and may generate different amounts of heat energy.

Figure 7:
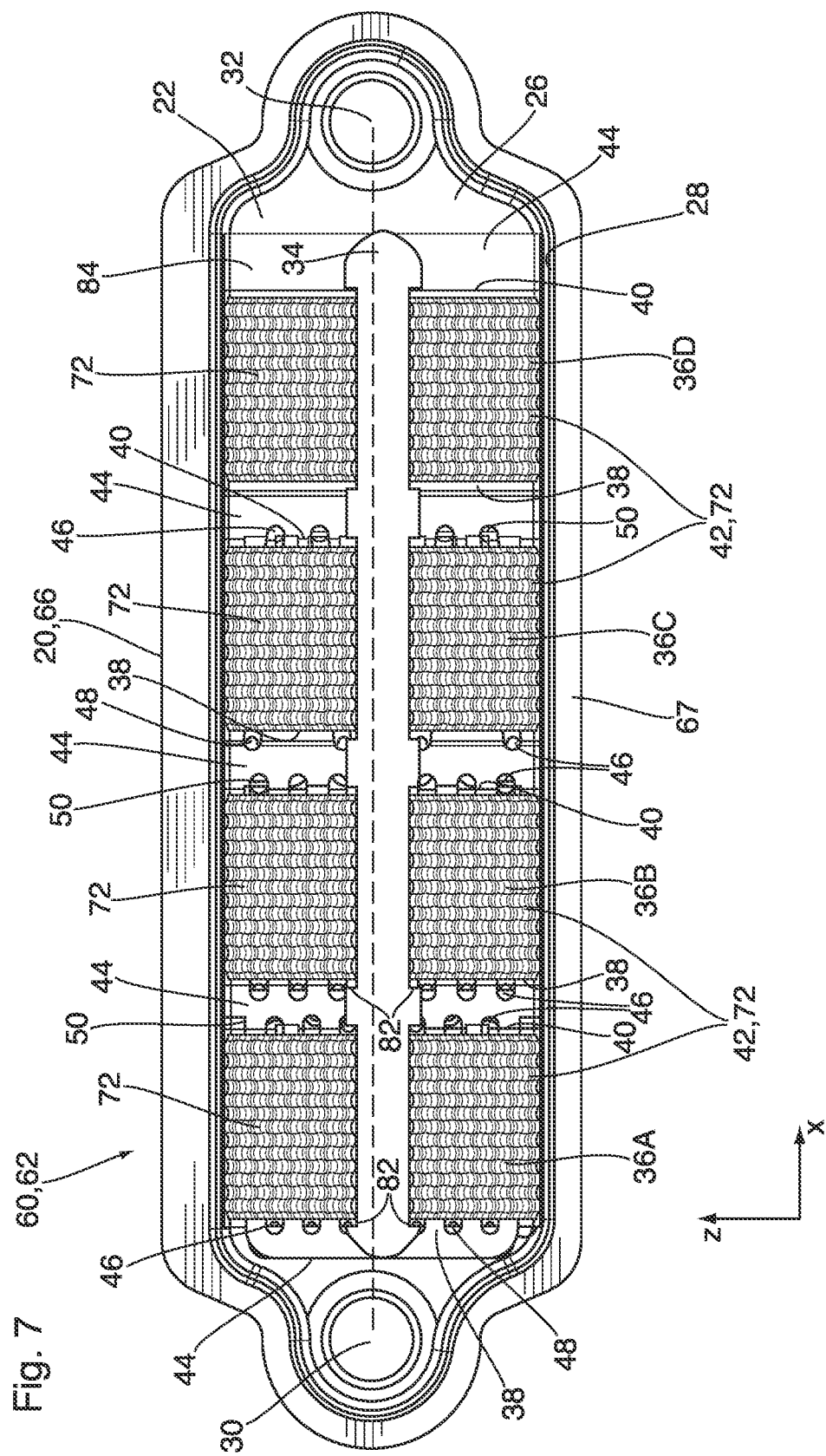
FIG. 7 is a top plan view of the heat exchanger assembly with the first plate removed.

A plurality of cooling zones 36 are defined along the fluid flow path 34, wherein the shape, size and area of each cooling zone 36 is substantially the same as the shape, size and area of one of the heat-generating substrates 2. In FIG. 7, the cooling zones 36 are distinguished by labelling them 36A to 36D along the fluid flow path 34 from the inlet port 30 to the outlet port 32. The cooling zones 36 are separated by intermediate manifold spaces 44, and inlet and outlet manifold spaces 44 are also provided proximate to the inlet and outlet ports 30, 32, as previously described above. In the present embodiment a central mounting rib 70 extends longitudinally through the fluid flow space 26. The rib 70 is present for the purpose of mounting the electronics package comprising heat-generating substrates 2 to the cooling plate 62, and is not essential to the embodiments described herein. Although not shown in the drawings, the plate components of the cooling plates 62 may include mounting holes.

Each cooling zone 36 of cooling plate 62 comprises one or more heat transfer elements 42. In the present embodiment, the one or more heat transfer elements 42 comprise one or more corrugated fin sheets 72 located within the fluid flow space 26. Due to the presence of mounting rib 70, each cooling zone 36 is provided with two corrugated fin sheets 72, however, in the absence of mounting rib 70 a single corrugated fin sheet 72 may instead be used in each cooling zone 36 (as in FIG. 18).

An example of a corrugated fin sheet 72 is shown in isolation in FIG. 9. Each corrugated fin sheet 72 includes a plurality of spaced sidewalls 74 extending lengthwise along the fluid flow path 34 and having a height defined in the thickness dimension of cooling plate 62. Adjacent sidewalls 74 are joined by top and bottom walls 76, 78, wherein the top walls 76 are adapted for direct contact with the inner surface 16 of heat sink plate 64/first plate wall 14, and are optionally metallurgically bonded thereto. The bottom walls 78 are spaced from the inner surface 22 of the second plate wall 20, wherein each of the bypass flow passages 46 is defined within this space. Between the sidewalls 74 are defined a plurality of fluid flow channels 80. The sides of fluid flow channels 80 are enclosed by the sidewalls 74, and the ends of the channels 80 are open at the upstream and downstream ends 38, 40 (FIG. 7) of the cooling zone 36.

The corrugated fin sheets 72 shown in the drawings have a wavy shape in plan view to maximize heat transfer surface area and provide turbulent flow in the heat transfer fluid. However, this specific type of corrugated fin sheet 72 is not essential. In this regard, the sidewalls 74 may be flat, may be imperforate or provided with apertures or louvers, the sidewalls 74 may be interrupted by offset portions; and the top and bottom walls 76, 78 may be rounded or flat. For example, the corrugated fin sheets 72 may comprise offset or lanced strip fins, examples of which are described in U.S. Pat. No. Re. 35,890 (So) and U.S. Pat. No. 6,273,183 (So et al.). The patents to So and So et al. are incorporated herein by reference in their entireties. To simplify manufacturing, all the corrugated fin sheets 72 may be identical with regard to the arrangement, shape and spacing of the corrugations. In the above discussion of temperature balancing and pressure drop, it is mentioned that the density/performance of heat transfer elements 42 may be increased. Where the heat transfer elements 42 comprise corrugated fin sheets 72, performance may be increased by decreasing spacing between the sidewalls 74, thereby increasing the density of the fin sheet 72. Increasing the density of the fin sheet 72 also increases its pressure drop.

The opposite sides of mounting rib 70 are provided with a plurality of notches 82 adapted to receive the edges of the corrugated fin sheets 72, thereby providing proper locating of the corrugated fin sheets 72, and consequently proper locating of the cooling zones 36, relative to the heat-generating substrates. In the absence of mounting rib 70, internally extending deformations or protrusions, such as dimples (not shown) may be provided within the fluid flow space 26 to provide a similar locating function. For example, locating elements may be provided in the second plate wall 20 and/or the sidewall 28 of embossed plate 66.

Alternatively, as shown in FIG. 7A, the correct positioning of corrugated fin sheets 72 in the longitudinal direction (x-axis) may be ensured by joining the corrugated fin sheets 72 together. For example, the corrugated fin sheets 72 may be formed from a larger (e.g. longer) fin sheet 73, with portions defining the intermediate manifold spaces 44 being removed by stamping or the like. However, the stamping of the intermediate manifold spaces 44 may leave narrow connecting portions 83 of the larger fin sheet 73, providing connections between the adjacent corrugated fin sheets 72. These connecting portions 83 are shown as being located along the edges of the larger fin sheet 73, however, they may be located anywhere across the width of sheet 73.

In the present embodiment, the bypass flow passages 46 are defined by slots in a diverter plate 84, as shown in FIG. 8. The diverter plate 84 is sized and shaped to be closely received within the fluid flow space 26, and sandwiched between the heat transfer elements 42 and inner surface 22 of the second plate wall 20, i.e. between the bottom walls 78 of corrugated fin sheets 72 and the embossed plate 66. As shown in the cross-section of FIG. 6, longitudinal gaps between the diverter plate 84 and longitudinal portions of sidewalls 28 are minimized to minimize the volume of bypass flow around the outer longitudinal edges of diverter plate 84. The opposite ends of diverter plate 84 are located in the inlet and outlet manifold spaces 44, proximate to the inlet and outlet ports 30, 32.

The height of the bypass flow passages 46 is defined by the thickness of the diverter plate 84. As can be seen in FIG. 7, the inlet and outlet openings 48, 50 are defined at opposite ends of each of the slots, and are located in fluid communication with the manifold spaces 44 in order to provide fluid mixing and flow diversion as described above. The diverter plate 84 shown in the drawings has slots which extend through the entire thickness of plate 84. However, this is not essential, and the slots may be closed on the side of plate 84 which contacts the second plate wall 20, in which case the bypass flow passages 46 may have a height which is less than the thickness of the diverter plate 84. The slots may be formed by machining or forging.

It can also be seen from FIG. 8 that the volume of bypass flow through passages 46 is greatest in the cooling zone 36A closest to the inlet port 30, due to the presence of eight bypass flow passages 46. It will be noted that the two outermost flow passages 46 are located along the outer edges of the diverter plate 84, and these bypass flow passages 46 will be partly defined by the peripheral sidewall 28, as indicated by the dotted lines in FIG. 8.

Cooling zone 36B is provided with six bypass flow passages 46 of similar dimensions, cooling zone 36C has four bypass flow passages, and cooling zone 36D closest to the outlet port 32 has no bypass flow passages 46. The bypass flow passages 46 in cooling zone 36C are angled relative to the longitudinal axis (x-axis), for example to promote side-to-side mixing of the heat transfer fluid within the manifold space 44 downstream of cooling zone 36C, and/or to funnel relatively cool heat transfer fluid from the area of mounting rib 70 and from the area of the peripheral sidewall 28, toward the areas in which the density of heat-generating components 68 is the greatest. As shown in FIG. 4, the density of the heat-generating components 68 is greatest about midway between the mounting rib 70 and the peripheral sidewall 28.

Another possible modification of diverter plate 84 is shown in FIG. 8, whereby one or more of the bypass flow passages 46 may extend over two or more adjacent cooling zones 36. In this regard, two of the bypass flow passages 46 of cooling zone 36B are shown as being joined to two of the bypass flow passages 46 of cooling zone 36C by connecting slots 47, shown in dotted lines. These connecting slots 47 may extend through at least a portion of the thickness of diverter plate 84, similar to the above description of the slots which define the bypass flow passages 46. Therefore, some of the fluid entering these bypass flow passages 46 at the manifold space 44 between cooling zones 36A and 36B bypasses cooling zones 36B and 36C, and is discharged into the manifold space 44 between cooling zones 36C and 36D.

Although the diverter plate 84 is disclosed within the context of cooling plate 62, it will be appreciated that a diverter plate could similarly be used to define the bypass flow passages 46 in cooling plate 10. Also, the pattern of bypass flow passages 46 of diverter plate 84 is designed to provide cooling of the specific arrangement of heat-generating substrates 2/components 68 shown in FIG. 4. The diverter plate 84 is easily customizable to change and calibrate the pattern of bypass flow passages 46 as dictated by the arrangement of heat-generating substrates 2 and components 68 on the outer heat transfer surface 18, and the relative amounts of heat generated by the heat-generating substrates 2/components 68.

Figure 10:
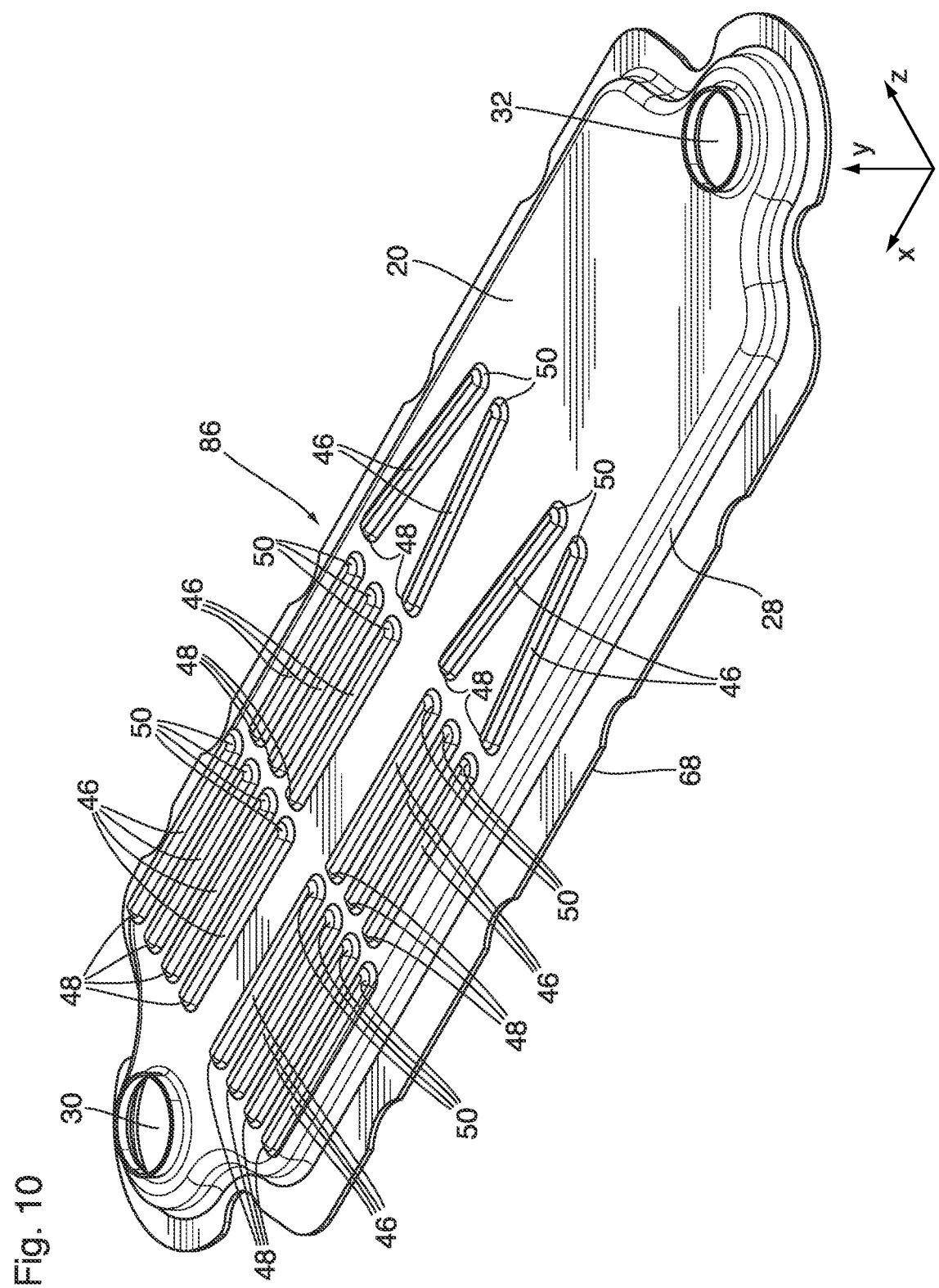
FIG. 10 is a perspective view of an embossed plate in accordance with an embodiment.

Instead of providing a separate diverter plate 84, it will be appreciated that the bypass flow passages 62 in cooling plates 10 and 62 could instead be provided by forming grooves in the inner surface 22 of the second plate wall 20. For example, the cooling plate 62 of FIG. 4 may be modified by replacing embossed plate 66 with an embossed plate 86 of FIG. 10, in which bypass flow passages 46 are integrally formed by grooves provided in the second plate wall 20. Where the second plate wall 20 forms part of an embossed plate, the grooves in the second plate wall 20 can comprise rib-like embossments, as in the embossed plate 86 of FIG. 10. In embodiments where the bypass flow passages 46 are defined by embossments in the second plate wall 20, the space filled by diverter plate 84 may be eliminated, such that the heat transfer elements 42 (e.g. fin sheets 72) may be in direct contact with portions of inner surface 22 of second plate wall 20 surrounding the embossed bypass flow passages 46.

The arrangement, length, width and number of bypass flow passages 46 embossed in the second plate wall 20 of embossed plate 86 may correspond to those of diverter plate 84, and therefore the above description of bypass flow passages 46 in diverter plate 84 applies to the bypass flow passages 46 of embossed plate 86. This allows the diverter plate 84 and the embossed plate 86 to be used together, if desired, with the bypass flow passages 46 being defined by the aligned slots of diverter plate 84 and the embossments of plate 86.

Figure 11:
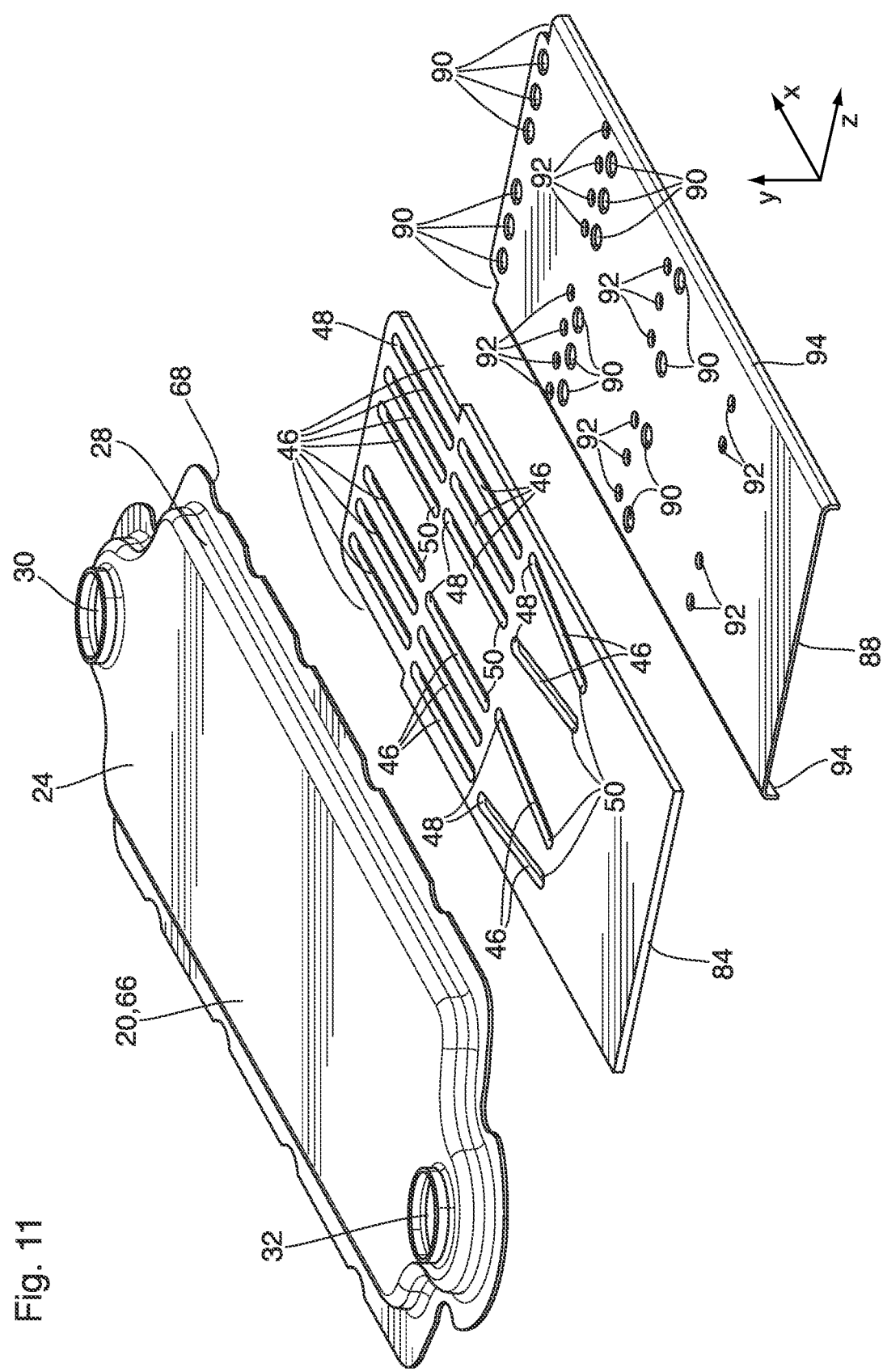
FIG. 11 is a perspective view of plate layers in accordance with an embodiment.
Figure 12:
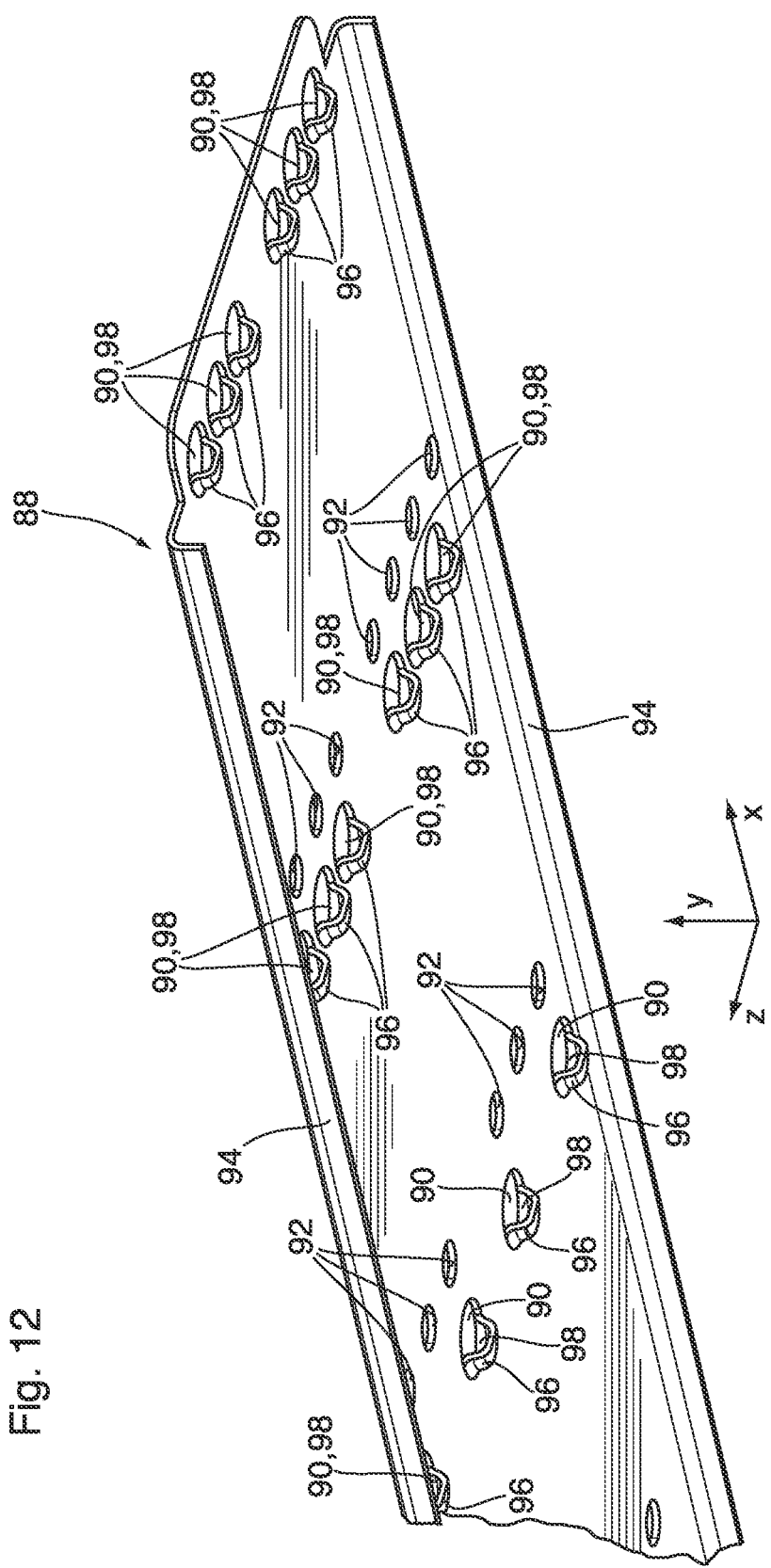
FIG. 12 is an enlarged perspective view of a portion of one of the plates shown in FIG. 11.

According to another embodiment, the cooling plate 62 of any of FIGS. 4-10 may be modified in accordance with FIGS. 11 and 12. FIG. 11 is an exploded view showing the embossed plate 66 and diverter plate 84, which are identical to those previously described above. In addition, FIG. 11 shows an additional orifice plate 88 which is intended to be sandwiched between the heat transfer elements 42 (i.e. corrugated fin sheets 72) and the diverter plate 84, or between the heat transfer elements 42 and the grooves formed in the second plate wall 20. The orifice plate 88 includes a plurality of spaced-apart inlet and outlet apertures 90, 92, wherein each inlet aperture 90 defines the inlet openings 48 of one or more bypass flow passages 46, and each outlet aperture 92 defines the outlet openings 50 of one or more bypass flow passages 46. In the present embodiment, the inlet and outlet apertures 90, 92 each define a single inlet or outlet opening 48, 50 of one bypass flow passage 46. However, one could replace one transverse row of inlet or outlet apertures 90, 92 with a continuous slot which would define the inlet or outlet openings 48, 50 of a plurality of bypass flow passages 46. Because they align with the inlet and outlet openings 48, 50 of the bypass flow passages 46, the apertures 90, 92 are also positioned in the manifold spaces 44 of the cold plate 62.

The orifice plate 88 effectively prevents mixing between the fluid flowing through the bypass flow passages 46 and the fluid flowing through the heat transfer elements 42 (e.g. corrugated fin sheets 72). The orifice plate 88 also allows calibration of the amount of bypass flow through the various bypass flow passages 46, for example by varying the sizes of the apertures 90, 92.

The orifice plate 88 may include downturned longitudinal edges 94 which are received between the outer longitudinal edges of the heat transfer elements 42 (corrugated fin sheets 72) and the peripheral sidewall 28 of cooling plate 62. The downturned edges 94 may seal against the peripheral sidewall 28 of cooling plate 62, to help to minimize bypass flow along the side edges of the cooling zones 36, i.e. between the longitudinal edges of corrugated fin sheets 72 and the peripheral sidewall 28. The downturned edges 94 may also include inwardly-extending protrusions to help ensure proper positioning of the corrugated fin sheets 72.

FIG. 12 shows the side of the orifice plate 88 which faces into the manifold spaces 44 between the cooling zones 36, and which faces the inner surface 16 of the first plate 14. In this embodiment, one or more of the inlet apertures 90 of orifice plate 88 is in the form of a perforated protrusion 96 having a conical sidewall adapted to protrude into one of the manifold spaces 44, with the protrusion 96 having a perforation 98 on its upstream-facing side to receive the heat transfer fluid flowing along the fluid flow path 34. In the present embodiment all the inlet apertures 90 comprise perforated protrusions 96, with the exception of two inlet apertures 90 proximate to inlet port 30, which are formed as notches in the outer edges of orifice plate 88. The perforations 98 in protrusions 96 are positioned to receive relatively hot heat transfer fluid flowing along the inner surface 16 of the first plate 18, and "pull" it away from the first plate 14 and into the bypass flow passage 46. Thus, the perforated protrusions 96 promote "up-down" mixing of the heat transfer fluid in the thickness dimension of cold plate 62.

Although only inlet apertures 90 of orifice plate 88 are provided with perforated protrusions 96, it will be appreciated that one or more of the outlet apertures 92 may similarly be provided with perforated protrusions 96, to promote fluid mixing and to promote contact between relatively cool bypass fluid and the inner surface 16 of first plate 14.

Figure 13:
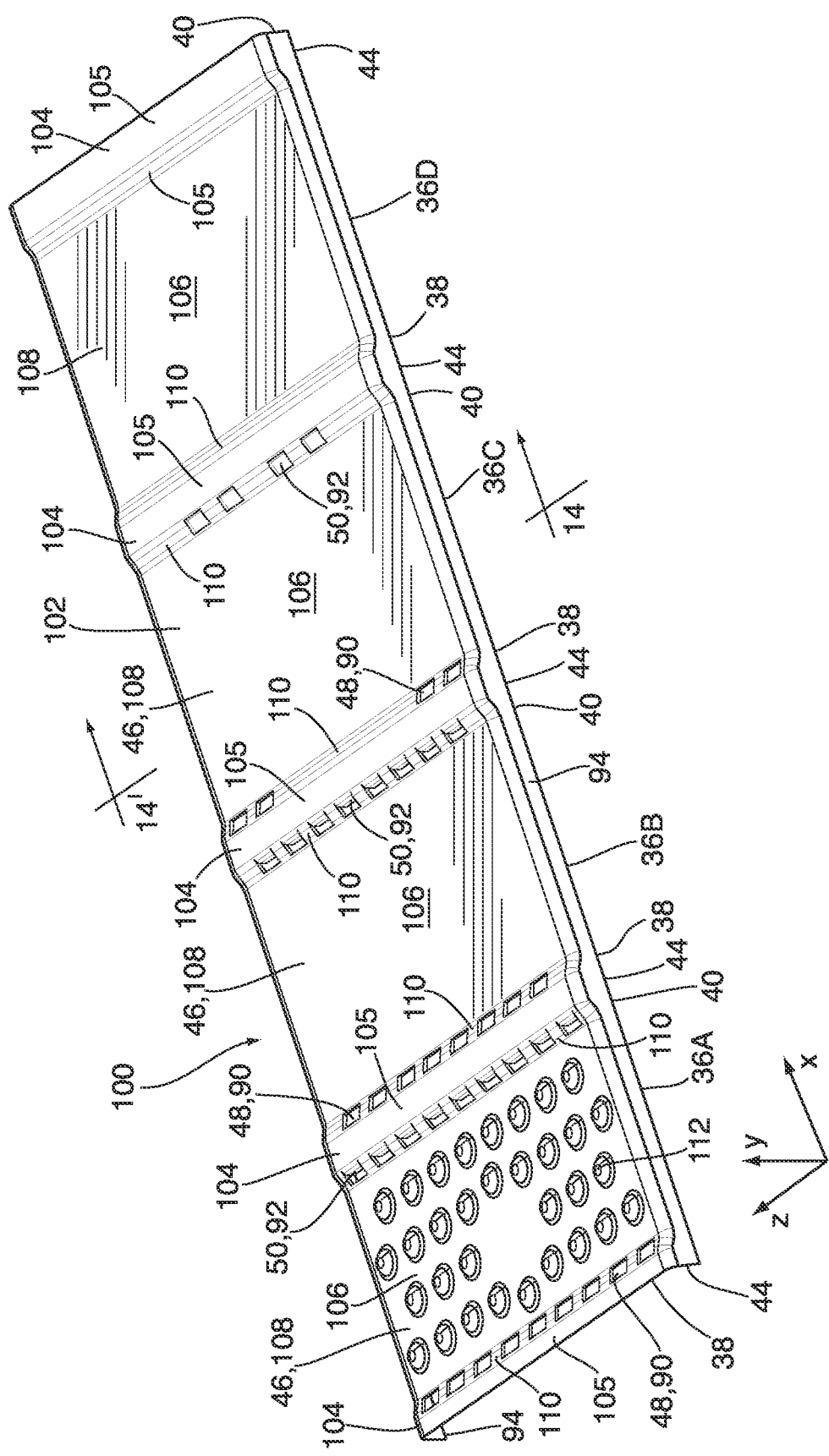
FIG. 13 is a perspective view of a diverter plate in accordance with an embodiment.

A further embodiment is now described with reference to FIGS. 13, 13A and 14. This embodiment is a variant of cooling plate 62 in which a diverter plate 100 as shown in FIG. 13 replaces and combines the functions of diverter plate 84 and orifice plate 88, described above.

The diverter plate 100 comprises a generally flat plate portion 102 having an area corresponding substantially to the combined areas of the cooling zones 36 and manifold spaces 44. Downturned longitudinal edges 94 identical to those described above are provided along the longitudinal edges of the flat plate portion 102. The surface of plate portion 102 which faces upwardly in FIG. 13 is adapted to face the inner surface 22 of second plate wall 20/embossed plate 66, as described above. The opposite surface of plate portion 102 faces toward the inner surface 16 of first plate 14/heat sink plate 64.

The plate portion 102 includes a plurality of transverse ribs 104 having raised upper surfaces 105 which are adapted to sealingly engage the inner surface 22 of the second plate wall 20. The locations of ribs 104 on plate portion 102 correspond to the locations of manifold spaces 44 in the fluid flow space 26. Between the transverse ribs 104 are reduced-height plate areas 106 which are adapted to contact the heat transfer elements 42 of the cooling zones 36 and create spacing gaps 108 (shown in FIG. 14) between the heat transfer elements 42 and the inner surface 22 of the second plate 20 for each of the cooling zones 36A, 36B, 36C and 36D. The locations of reduced-height plate areas 106 on plate portion 102 correspond to the locations of cooling zones 36A to 36D in the fluid flow space 26.

The spacing gaps 108 corresponding to cooling zones 36A, 36B define the bypass flow passages 46 of these cooling zones. In this embodiment, only one bypass flow passage 46 is provided for each of cooling zones 36A, 36B and 36C, with each of the bypass flow passages 46 corresponding to one of the spacing gaps 108. Therefore, in the present embodiment, all the bypass flow passages 46 have the same size, shape and volume.

Instead of varying the number of bypass flow passages 46 of the different cooling zones 36, the present embodiment provides bypass flow passages 46 having the same dimensions. Calibration of the fluid flow through bypass flow passages 46 can be achieved by varying the area and/or number of the inlet and/or outlet openings 48, 50. In the present embodiment, the inlet and outlet openings 48, 50 comprise apertures 90, 92 provided in the sidewalls 110 of transverse ribs 104, with the inlet openings 48 being provided in upstream-facing sidewalls 110, and the outlet openings 50 being provided in downstream-facing sidewalls 110. In the present embodiment, the sidewalls 110 form sloped transitions between the reduced-height plate areas 106 and the top surfaces 105 of ribs 104, however, it is not essential that the sidewalls 110 are sloped. For example, they may instead be vertical.

The sidewalls 110 are shown in the drawings as being parallel to the z-axis and perpendicular to the fluid flow path 34. However, this is not essential. Rather, portions of sidewalls 110 may be sloped relative to the z-axis, with the result that the apertures 90, 92 will be angled relative to the z-axis. This angling of apertures 90, 92 can provide a similar fluid mixing effect as the angled bypass flow passages 46 of cooling zone 36C of FIG. 8, discussed above. The apertures 90, 92 may themselves be shaped, for example such as perforated protrusions 96 discussed above, to provide this angled flow.

It can be seen that there are no inlet or outlet openings 48, 50 provided for the spacing gap 108 corresponding to the cooling zone 36D, which is closest to the outlet port (not shown). Therefore, the spacing gap 108 for cooling zone 36D is sealed by ribs 104 and downturned edges 94. Therefore, spacing gap 108 is not a bypass flow passage 46, but is merely provided so that cooling zone 36D can contain the same heat transfer element 42 (corrugated fin sheet 72) as the other cooling zones 36A, 36B and 36C. Substantially all the fluid flows through the heat transfer element 42 of cooling zone 36D, due to the absence of any bypass flow passage(s) 46 traversing this cooling zone 36D.

The spacing gaps 108 corresponding to cooling zones 36A, 36B and 36C include varying numbers of inlet and outlet openings 48, 50 to provide calibration of bypass flow in the bypass flow passages 46. In this regard, the spacing gap 108 corresponding to cooling zone 36A has more/larger inlet and outlet openings 48, 50 than cooling zone 36B, and therefore the flow through the bypass flow passages 46 in cooling zone 36A is greater than that in cooling zone 36B. Similarly, the bypass flow passage 46 of cooling zone 36C has fewer inlet and outlet openings 48, 50 than the bypass flow passage 46 corresponding to cooling zone 36B, meaning that the flow through the bypass flow passage 46 of cooling zone 36C will be less than that in the bypass flow passages 46 of cooling zone 36B. The inlet and outlet openings 48, 50 in the bypass flow passage 46 corresponding to cooling zone 36C are transversely offset as in the embodiments discussed above, to provide transverse flow of cool fluid to the areas in which the density of heat-generating components 68 is greatest.

The spacing gap 108 corresponding to cooling zone 36A is shown as including a plurality of reinforcing elements in the form of raised protrusions or dimples 112, which correspond in height to transverse ribs 104. Therefore, in the assembled cooling plate 62 the top surfaces of dimples 112 contact the inner surface 22 of second plate wall 20 to provide reinforcement within the spacing gap 108. Similar reinforcement may be provided in the other spacing gaps 108.

FIG. 13A shows a close-up of a portion of diverter plate 100, specifically a portion of rib 104 corresponding to the manifold space between cooling zone 36B and 36C. The outlet aperture 92 defining the outlet opening 50 of the bypass flow passage 46 for cooling zone 36B is shown as having a flow guiding tab 113, comprising a projection inside outlet opening 50/aperture 92, which is directed into the manifold space 44. Such tabs 113 may be integrally formed as part of diverter plate 100, by incompletely cutting out the outlet opening 50/aperture 92, and bending the cutout into the opening 50/aperture 92. The tabs 113 improve fluid mixing in the manifold space by directing the fluid flow toward the inner surface 16 of first plate 14/heat sink plate 64. Similar tabs may be provided at inlet opening 48/aperture 90 to promote flow of hot fluid away from the first plate 14 and into the bypass flow passage 46. The tabs 113 may also be twisted or canted to promote transverse fluid mixing.

Figure 15:
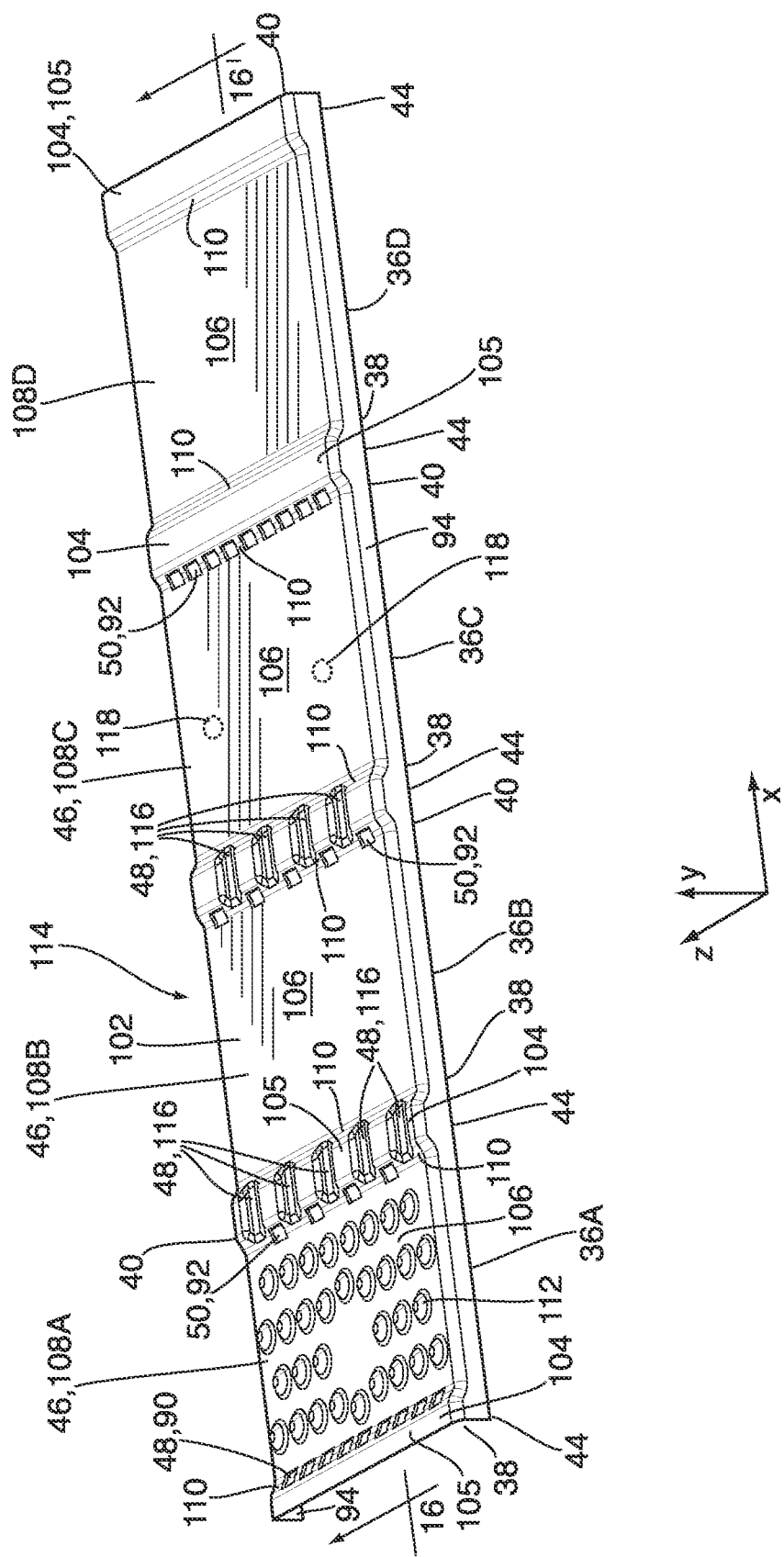
FIG. 15 is a perspective view of a diverter plate in accordance with an embodiment.
Figure 16:
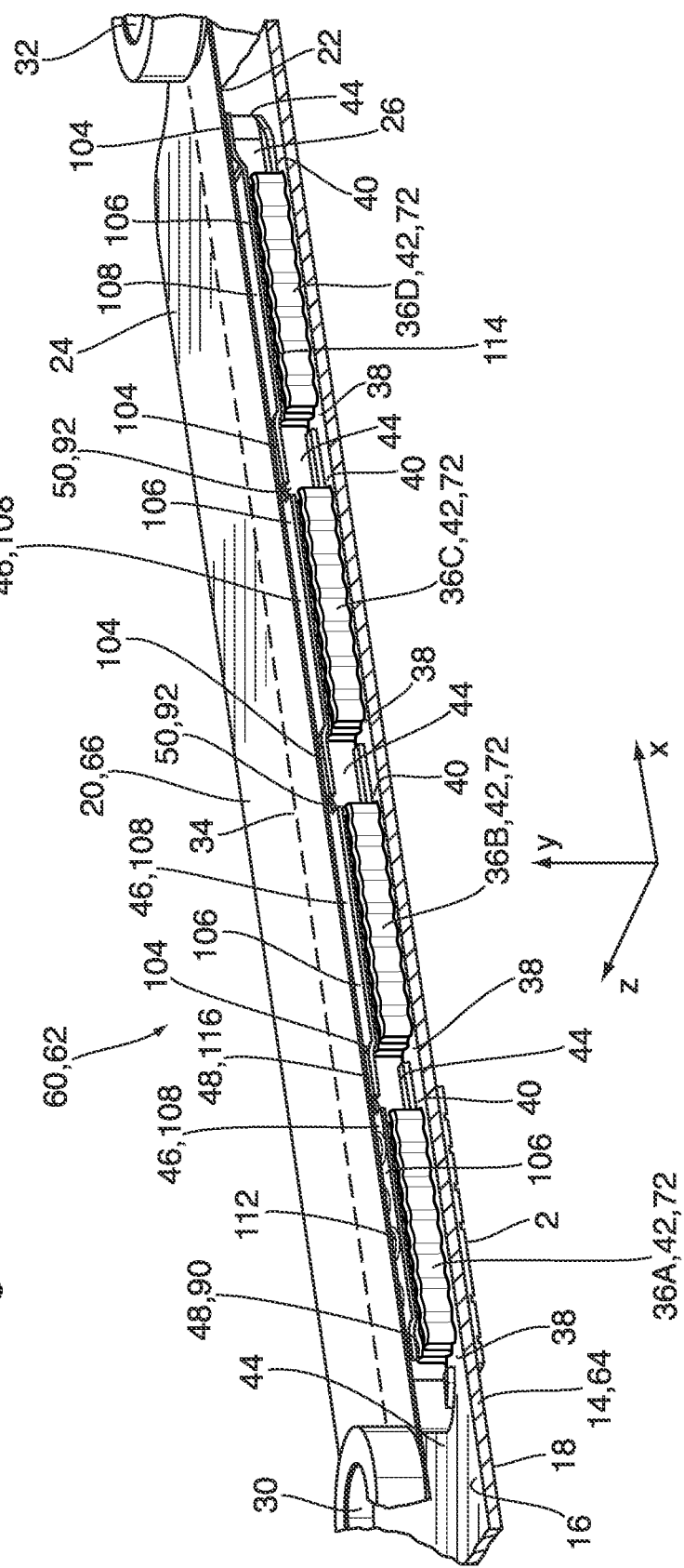
FIG. 16 is a longitudinal cross section along line 16-16' of FIG. 15, showing a cooling plate incorporating the diverter plate of FIG. 15.

A further embodiment is now described with reference to FIGS. 15 to 16. The embodiment of FIGS. 15 and 16 is a variant of cooling plate 62 in which a diverter plate 114 as shown in FIG. 15 replaces and combines the functions of diverter plate 84 and orifice plate 88, described above. Furthermore, the diverter plate 114 of FIG. 15 includes most of the features of the diverter plate 100 described above, and the above description of these like elements applies equally to the description of the present embodiment.

The diverter plate 114 comprises a plurality of reduced-height plate areas 106 separated by transverse ribs 104, thereby providing a plurality of spacing gaps 108 corresponding to cooling zones 36A, 36B, 36C and 36D. These spacing gaps 108 are correspondingly numbered as 108A, 108B, 108C and 108D to simplify the following description. As in diverter plate 100, the first three spacing gaps 108A, 108B and 108C of diverter plate 114 correspond to cooling zones 36A, 36B and 36C, and comprise bypass flow passages 46, due to the presence of inlet and outlet openings 48, 50. In contrast, the fourth spacing gap 108D corresponding to cooling zone 36D does not comprise a bypass flow passage 46 since it lacks inlet and/or outlet openings 48, 50.

The bypass flow passage 46 defined by spacing gap 108A includes inlet and outlet openings 48, 50 provided in the sidewalls 110 of transverse ribs 104, as described above. Therefore spacing gap 108A is adapted to receive cool fluid directly from the inlet port 30 (FIG. 16). The two bypass flow passages 46 corresponding to intermediate spacing gaps 108B and 108C are provided with outlet openings 50, however, these bypass flow passages 46 are not provided with inlet openings 48 communicating with the intermediate manifold spaces 44. Therefore, these two bypass flow passages 46 do not receive heat transfer fluid from the manifold spaces 44. Instead, the inlet openings 48 are defined by one or more grooves 116 provided in the top surfaces of the two transverse ribs 104 separating the spacing gaps 108A, 108B and 108C. These grooves 116 are directed along the fluid flow path 34 and allow a calibrated amount of fluid communication from the inlet openings 48 of the first spacing gap 108A to feed cool fluid to the intermediate spacing gaps 108B and 108C. Therefore, the two bypass flow passages 46 corresponding to spacing gaps 108B and 108C will receive fluid at a lower temperature than that which is flowing through the manifold spaces 44. A portion of this relatively cool fluid will enter the manifold space 44 between cooling zones 36B and 36C, and the remainder of the cool fluid will enter the manifold space 44 between cooling zones 36C and 36D. The cross-section of FIG. 16 more clearly shows the separation of spacing gaps 108 by transverse ribs 104, and also shows one of the grooves 116 between spacing gaps 108A and 108B.

FIG. 15 shows two optional apertures 118 in dotted lines, in one of the spacing gaps 108. These apertures 118 may be provided to take some relatively cool fluid from one of the bypass flow passages 46 and inject it directly into one of the cooling zones 36. For example, these apertures 118 may provide supplemental cooling of hot spots at which one or more heat-generating components 68 are located. Therefore, the location of each aperture 118 may correspond to the locations of one or more heat-generating components 68 on the outer heat transfer surface 18.

The cooling plates 10 and 62 described above are adapted for cooling a plurality of heat-generating substrates 2 provided in thermal contact with only one of the plate walls, namely the first plate wall 14. However, in some embodiments, it may be desirable to provide heat-generating substrates 2 in thermal contact with the outer surfaces 18, 24 of both the first and second plate walls 14, 20. Heat exchangers incorporating cooling plates for two-sided cooling are disclosed, for example, in commonly assigned US Publication No. US 2018/0252479 A1 by Kenney et al., which is incorporated herein by reference in its entirety.

A cooling plate 122 for two-sided cooling, which may be used on its own or as a component of a stacked heat exchanger assembly as described by Kenney et al., is now described below with reference to FIGS. 17 and 18. Cooling plate 122 of FIGS. 17 and 18 includes many of the same elements as the cooling plates described above, and are identified with like reference numerals. The above descriptions of these like-numbered elements apply equally to cooling plate 122 of FIGS. 17 and 18.

Figure 17:
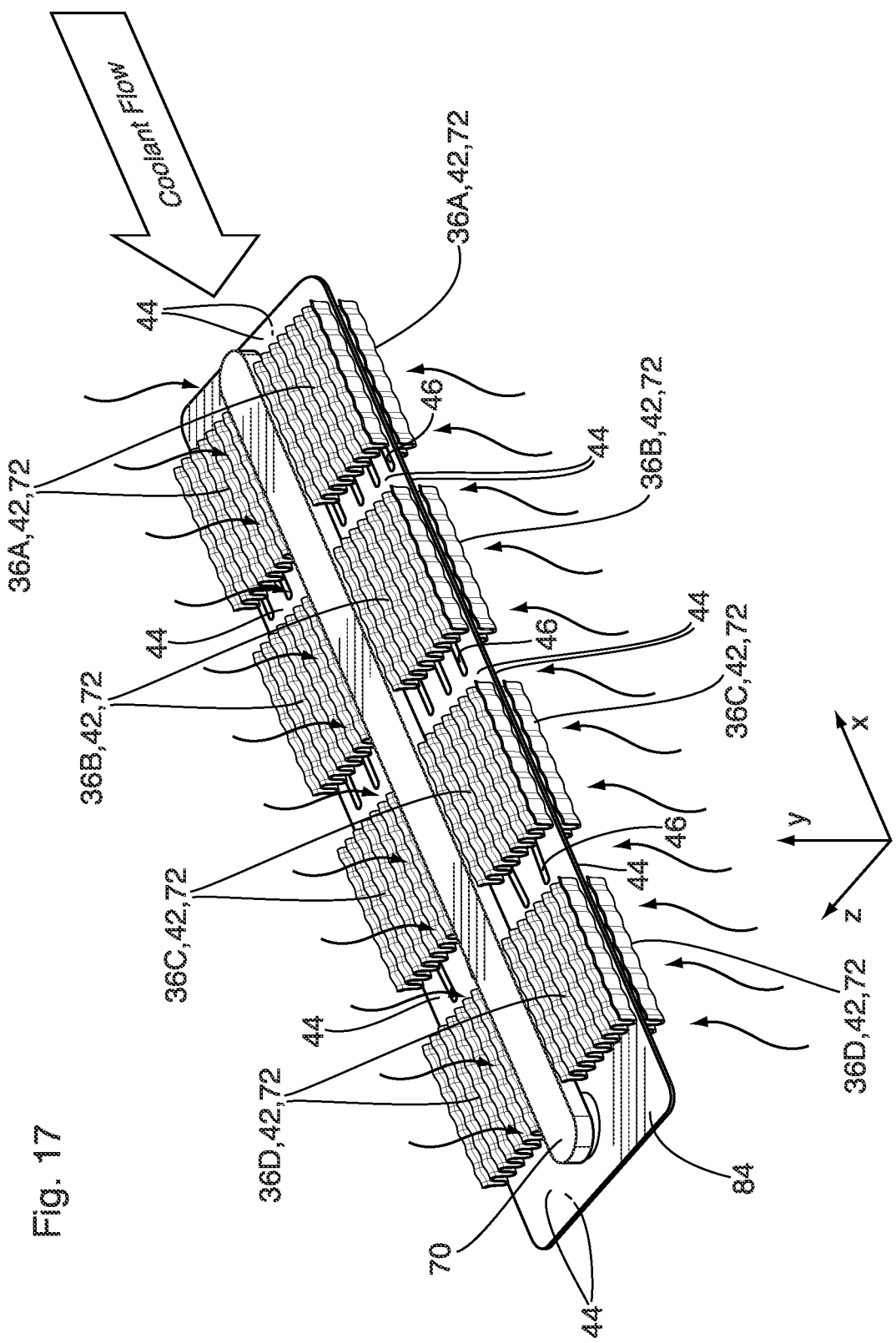
FIG. 17 shows an arrangement of heat transfer elements and a diverter plate for a two-sided cooling plate.

FIG. 17 illustrates the internal components of a cooling plate for two-sided cooling, and FIG. 18 shows a transverse cross-section (along z-axis) through a cooling plate 122 for two-sided cooling. The plate walls 14, 20 shown in FIG. 18 may be as shown in Kenney et al., with both the first and second plate walls 14, 20 being formed in stamped plates. The resulting cooling plate 122 may include aligned inlet and outlet ports 30, 32 in both plates, such that the cooling plates 122 can be stacked as shown in Kenney et al.

As shown in FIG. 17, the bypass flow passages 46 are centrally located between two layers of heat transfer elements 42, which may comprise corrugated fin sheets 72. In the present embodiment, the bypass flow passages 46 are provided by slots in a diverter plate 84, as described above. It will be appreciated that orifice plates 88 may be provided between the diverter plate 84 and each layer of corrugated fin sheets 72, or the diverter plate 84 may be replaced by a diverter plate 100 or 114, or a pair of such diverter plates 100 or 114 arranged face-to-face.

FIG. 18 shows cooling plates 122 which generally have the same internal structure as shown in FIG. 17, except that they lack a mounting rib 70. A plurality of cooling plates 122 are arranged in a stack to form a stacked heat exchanger assembly as described in Kenney et al., wherein heat-generating substrates (not shown in FIG. 18) can be inserted in the spaces between adjacent cooling plates 122.

The heat transfer elements 42 comprising corrugated fin sheets 72 which are in contact with the inner surfaces 16, 22 of respective plate walls 14, 20. Each plate wall 14, 20 is formed as part of an embossed heat exchanger plate similar to embossed plate 66 described above. Each embossed plate of FIG. 18 therefore includes a peripheral sidewall 28 and peripheral flange 67. The inlet and outlet ports 30, 32 are formed in raised bosses (inlet bosses only shown in FIG. 18) which are joined together to form inlet and outlet manifolds communicating with the fluid flow spaces 26 within the cooling plates 122.

It can be seen from FIG. 18 that each cooling plate 122 includes a plurality of first cooling zones 36 sandwiched between bypass flow passage(s) 46 and the inner surface 16 of the first plate wall 14, and a plurality of second cooling zones 36 sandwiched between bypass flow passage(s) 46 and the inner surface 22 of the second plate wall 20. The cooling plate 122 similarly includes pluralities of first and second manifold spaces 44 between the bypass flow passage (s) and the respective first and second plate walls 14, 20, these first and second manifold spaces 44 being shown in FIG. 17, on opposite sides of diverter plate 84. Therefore, there are cooling zones 36 on both sides of the cooling plate 122, with the bypass flow passage(s) 46 being located centrally, away from the first and second plate walls 14, 20. Therefore, cooling plate 122 is adapted for cooling heat-generating substrates (not shown) in thermal contact with the outer surfaces 18, 24 of the first and second plate walls 14, 20. It will be appreciated that the number, size and/or spacing of heat-generating substrates 2 may be the same or different on opposite sides of the cooling plate 122, and the amounts of heat generated by the substrates 2 may also be the same or different.

Although the invention has been described in connection with certain embodiments, it is not restricted thereto. Rather, the invention includes all embodiments which may fall within the scope of the following claims.

What is claimed is:

1. A heat exchanger assembly comprising a cooling plate with an outer heat transfer surface adapted for thermal contact with one or more heat-generating substrates, the outer heat transfer surface having an area defined in a first plane, the cooling plate having a thickness defined in a second plane which is perpendicular to the first plane;

the cooling plate comprising:
a first plate wall and a second plate wall spaced apart in the second plane, the first and second plate walls each having an inner surface and an outer surface, wherein the inner surfaces of the first and second plate walls face each other, and wherein the outer heat transfer surface is defined by the outer surface of the first plate wall;

a hollow interior defined between the first and second plate walls;

a fluid flow space defined in the hollow interior;

an inlet port and an outlet port spaced apart in the first plane and in fluid communication with the fluid flow space, wherein a fluid flow path is defined in the fluid flow space from the inlet to the outlet;

a plurality of cooling zones defined along the fluid flow path, wherein the cooling zones are spaced apart from one another along the fluid flow path, each cooling zone having an upstream end for receiving a heat transfer fluid flowing along the fluid flow path and a downstream end for discharging the heat transfer fluid along the fluid flow path, wherein each said cooling zone comprises one or more heat transfer elements which are in contact with the inner surface of the first plate wall;

a plurality of manifold spaces in the hollow interior, including an inlet manifold space proximate to the inlet, an outlet manifold space proximate to the outlet, and at least one intermediate manifold space, each said intermediate manifold space comprising a gap between the downstream end of one said cooling zone and the upstream end of an adjacent said cooling zone;

a bypass flow passage extending between the upstream and downstream ends of one of said cooling zones and adapted to divert a portion of the heat transfer fluid from flowing through the cooling zone, the bypass flow passage including at least one inlet opening at the upstream end of the cooling zone and at least one outlet opening at the downstream end of the cooling zone;

wherein the cooling plate includes a plurality of said bypass flow passages;

wherein the cooling plate further comprises a diverter plate which is closely received within the fluid flow space, between the heat transfer elements and the inner surface of the second plate wall; and wherein the diverter plate comprises a plurality of transverse ribs, each having a raised upper surface in sealed engagement with the inner surface of the second plate wall, wherein the locations of ribs correspond to the locations of the manifold spaces in the fluid flow space;

wherein the diverter plate further comprises reduced-height plate areas between the transverse ribs, and separated from one another by the transverse ribs;

wherein the reduced-height plate areas are in contact with the heat transfer elements and wherein each of the reduced-height plate areas is spaced from the inner surface of the second plate wall by a spacing gap; and wherein at least one of the spacing gaps defines one of the bypass flow passages.

2. The heat exchanger assembly of claim 1, wherein the at least one outlet opening of at least one said bypass flow passage is in fluid communication with one said manifold space at the downstream end of the cooling zone.

3. The heat exchanger assembly of claim 1, wherein the at least one inlet opening of at least one said bypass flow passage is in fluid communication with one said manifold space at the upstream end of the cooling zone, and the at least one outlet opening of the at least one said bypass flow passage is in fluid communication with another said manifold space at the downstream end of the cooling zone.

4. The heat exchanger assembly of claim 1, wherein a volume of bypass flow for a first said cooling zone is calibrated to be different from a volume of bypass flow for a second said cooling zone, depending on the amount of cooling required in the first and second cooling zones;

wherein said volume of bypass flow is calibrated by varying the area and/or number of the inlet openings and/or outlet openings of the bypass flow passages for the first and second cooling zones.

5. The heat exchanger assembly of claim 1, wherein at least one said bypass flow passage is provided for each of the cooling zones except for the cooling zone closest to the outlet opening, such that substantially all the heat transfer fluid flows through the cooling zone closest to the outlet opening.

6. The heat exchanger assembly of claim 1, wherein at least one of said cooling zones is provided with a plurality of said bypass flow passages.

7. The heat exchanger assembly of claim 1, wherein each of said heat transfer elements comprises a corrugated fin sheet comprising a plurality of spaced sidewalls extending along the fluid flow path, and comprising top and bottom walls which join adjacent sidewalls together;

wherein the top walls are in direct contact with the inner surface of the first plate wall, and the bottom walls are spaced from the inner surface of the second plate wall; and wherein at least one said bypass flow passage is defined within a space between the bottom wall of a corrugated fin sheet and the inner surface of the second plate wall.

8. The heat exchanger assembly of claim 1, wherein at least one of the bypass flow passages includes a plurality of said inlet openings;

wherein each of the plurality of inlet openings comprises an aperture in the diverter plate, providing flow communication between the spacing gap and one of the manifold spaces; and wherein the plurality of said inlet openings of at least one of the bypass flow passages is formed in an upstream-facing sidewall of one of the transverse ribs.

9. The heat exchanger assembly of claim 8, wherein the diverter plate has downturned longitudinal edges which are adapted to seal against a peripheral longitudinal sidewall of the cooling plate to minimize bypass flow between the peripheral sidewall and longitudinal outer edges of the heat transfer elements.

10. The heat exchanger assembly of claim 1, wherein at least one of the bypass flow passages includes a plurality of said outlet openings; and wherein each of the plurality of outlet openings comprises a groove extending along the fluid flow path across the top surface of one of the transverse ribs;

wherein each of the grooves provides fluid communication between a pair of said spacing gaps which are separated by the transverse rib in which the groove is provided.

11. The heat exchanger assembly of claim 1, wherein at least one of the bypass flow passages includes a plurality of said outlet openings; and wherein each of the plurality of outlet openings comprises an aperture in the diverter plate, providing flow communication between the spacing gap and one of the manifold spaces.

12. The heat exchanger assembly of claim 11, wherein the plurality of said outlet openings of at least one of the bypass flow passages is formed in a downstream-facing sidewall of one of the transverse ribs.

* * * * *